United States Patent
Tsorng et al.

(10) Patent No.: US 12,213,272 B2
(45) Date of Patent: Jan. 28, 2025

(54) CARRIER DEVICE FOR VARIABLE THICKNESS E1.S STORAGE DEVICES

(71) Applicant: Quanta Computer Inc., Taoyuan (TW)

(72) Inventors: Yaw-Tzorng Tsorng, Taoyuan (TW);
Tung-Hsien Wu, Taoyuan (TW);
Yu-Ying Tseng, Taoyuan (TW);
Wei-Jie Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 197 days.

(21) Appl. No.: 18/066,057

(22) Filed: Dec. 14, 2022

(65) Prior Publication Data
US 2024/0155798 A1 May 9, 2024

Related U.S. Application Data

(60) Provisional application No. 63/382,977, filed on Nov. 9, 2022.

(51) Int. Cl.
*H05K 7/14* (2006.01)
(52) U.S. Cl.
CPC .................. *H05K 7/1489* (2013.01)

(58) Field of Classification Search
None
See application file for complete search history.

(56) References Cited

U.S. PATENT DOCUMENTS 10,674,621 B1* 6/2020 Tsorng ............... H05K 5/0213
2022/0342463 A1* 10/2022 Norton .................. G06F 1/187

FOREIGN PATENT DOCUMENTS

CN      114253361 A  *  3/2022  ........... G06F 1/187

* cited by examiner

*Primary Examiner* — James Wu
*Assistant Examiner* — Christopher L Augustin
(74) *Attorney, Agent, or Firm* — NIXON PEABODY LLP

(57) ABSTRACT

A carrier for different form factors for insertion in a slot of a computing device is disclosed. The different form factors have different thicknesses defined by the E1.S specification. The carrier includes a base holding a first type of form factor. A bezel is configurable for insertion in a slot for a device of the first type of form factor. The bezel has an attachment surface. The base is attachable to the attachment surface of the bezel. A second type of form factor is also attachable to the attachment surface of the bezel. A cover encloses the first type of form factor when joined to the base. The base and cover are discarded when the second type of form factor is attached to the bezel. The attached bezel and second type of form factor may also be inserted in the slot.

20 Claims, 27 Drawing Sheets

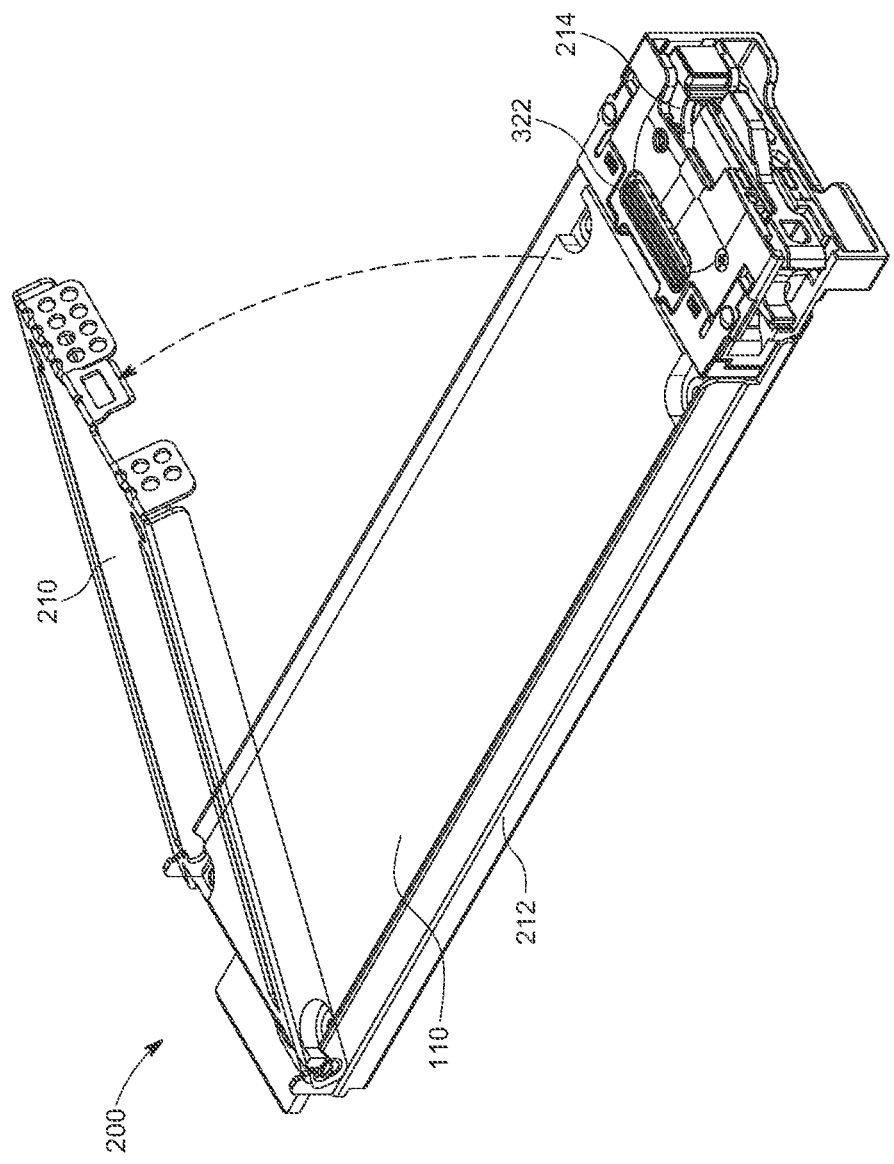

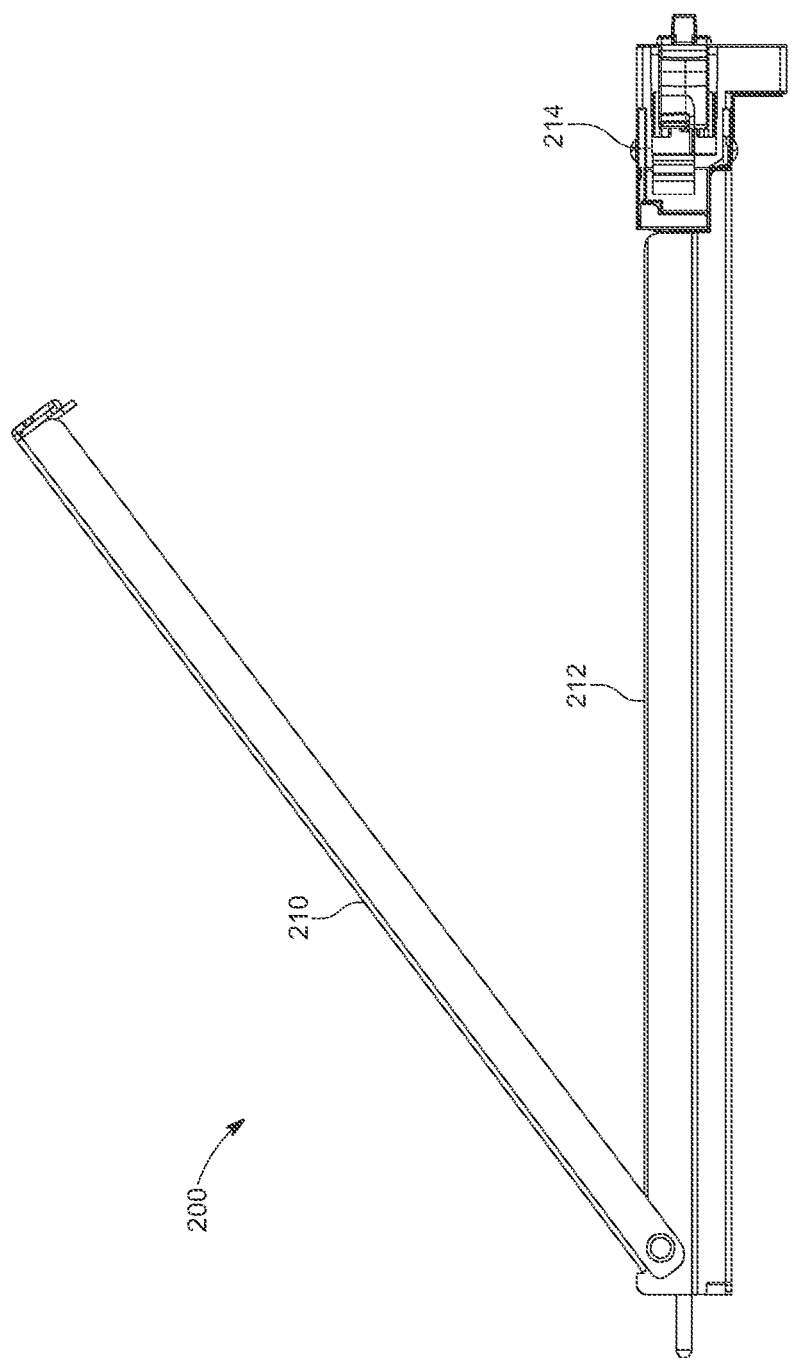

CARRIER DEVICE FOR VARIABLE THICKNESS E1.S STORAGE DEVICES

PRIORITY CLAIM

This application claims benefit of and priority to under 35 U.S.C. § 119 to U.S. Provisional Application No. 63/382,977, filed on Nov. 9, 2022. The contents of that application are hereby incorporated by reference in their entirety.

TECHNICAL FIELD

The present disclosure relates generally to a carrier of high capacity electronic components that may be inserted into modular slots in a server. More particularly, aspects of this disclosure relate to a carrier that may be used for different dimension E1.S form factors.

BACKGROUND

Electronic devices, such as servers, include numerous electronic components that are powered by a common power supply. Generally, servers are directed toward specific functions such as storing large amounts of data or processing. Server design begins with a chassis that includes power components and general controllers such as a baseboard management controller. Current large server designs include slots for server sleds that have processors, memory, power and network interfaces. Such sleds in turn include expansion slots that accept expansion device cards that may be plugged in to perform additional server functions, such as storage or processing. For example, a storage server sled may include slots for accommodating additional solid state drive (SSD) device cards while a processing server may include slots for more device cards with processing units.

As explained previously, storage server sleds may include solid state drive (SSD) based expansion cards to increase storage capability. The current generation of SSD cards are based on carriers for the memory chips following the M.2 form factor standard, such as the M.2 22110. Thus, carriers are specifically designed to hold components that are designed based on the M.2 form factor. For example, the M.2 22110 mechanical specification has a top side component area that is approximately 22 mm by 110 mm with a golden finger type connector at one end.

Next generation storage cards generally favor the larger form factor dimensions to accommodate greater storage capability in SSD devices. In 2018, the Storage Networking Industry Association (SNIA) published a new type of storage device specification (SFF-TA-1006), the Enterprise and Datacenter 1U Short Device Form Factor (E1.S). This specification defines the mechanical attributes of a 1U short form factor for a device with multiple thicknesses that will fit vertically in standard 1U rack mounted host systems. The application environment for the 1U short form factor is a cabinet or enclosure connecting to one or more add-in form factors. 1U refers to 1 standard unit of an IT equipment rack and the IT enclosures that fit in this space. The device form factor is intended for use in enclosures that fit within that given space. The primary use of such a form factor is for datacenter server and storage systems that require high capacity and performance highly scalable in 1U. Such devices in these form factors connect electrically to the server or storage system through a card edge connector.

The E1.S specification describes a number of different form factors that have different thicknesses. For example, the form factors defined in the E1.S standards include five different kinds of form factors with different thickness. There are multiple thicknesses of the 1U short form factor depending on the maximum power rating. The definition of mounting holes and component placement area allows for attachment of mechanicals to adapt among different enclosure chassis, such as rails and latching. FIG. 1 shows four of the E1.S form factors defined by the specification. FIG. 1 shows a 1U Short Form Factor 110 having a 5.9 mm thickness, a 1U Short Form Factor 120 with an optional heat spreader having a 8.01 mm thickness, a 1U Short Form Factor 140 with an optional symmetric enclosure with a 9.5 mm thickness, and a 1U Short Form Factor 150 with an optional asymmetric enclosure having a 15 mm thickness. Another form factor has a 25 mm thickness with the same shape as the short form factor 150.

The form factor 110 includes a printed circuit board 112 with an edge connector 114. An enclosure 116 is attached to the printed circuit board 112. Each of the corners of the enclosure 116 include a cutout 118 that allows access to mounting holes in the printed circuit board 112. The form factor 120 includes a printed circuit board 122 with an edge connector 124. An enclosure 126 is attached to the printed circuit board 122. Each of the corners of the support enclosure 126 include a cutout 128 that allows access to mounting holes in the printed circuit board 122. A heat spreader 130 is installed on the enclosure 126 to dissipate heat generated by the components on the circuit board 122.

The form factor 140 includes a circuit board with an edge connector 142. The circuit board is supported by a symmetrical enclosure 144. The symmetric enclosure 144 has a flat surface with an overhanging tab 146 on one end. The overhanging tab 146 has two screw holes 148 that allow attachment to a carrier.

The form factor 150 includes a circuit board with an edge connector 152. The circuit board is supported by a symmetric enclosure 154. The symmetric enclosure 154 has a flat surface with an overhanging tab 156 on one end. The overhanging tab 156 has two screw holes 158 that allow attachment to a carrier. An optional asymmetric enclosure 160 is provided on the enclosure 154. The asymmetric enclosure 160 serves as a heat fin that allows dissipation of heat from the device in the form factor 150.

Currently, the different form factors 110, 120, 140, and 150 require different types of carriers due to their different shapes and thicknesses. Since the carriers for the form factors 110, 120, 140, and 150 are different, none of the carriers may be substituted for each other and thus different carriers must be made available for each of the form factors. The need for different carriers makes changing form factors difficult. This lack of flexibility increases the expense of swapping out components for servers and other devices in a data center.

Thus, there is a need for a carrier that may be adapted to form factors of different thicknesses. There is another need for a carrier that may be installed in a receiving slot without requiring tools. There is yet another need for a carrier that allows the efficient attachment of different form factors.

SUMMARY

One disclosed example is carrier for attachment to different form factors. The carrier includes a base holding a first type of form factor. A bezel is configurable for insertion in a slot for a device of the first type of form factor. The bezel has an attachment surface. The base is attachable to the attachment surface of the bezel. A second type of form factor is attachable to the attachment surface of the bezel. The carrier also includes a cover enclosing the first type of form factor when joined to the base. The base and cover are discarded when the second type of form factor is attached to the bezel. The bezel and attached second type of form factor are insertable in the slot.

In another implementation of the disclosed example carrier, the bezel includes a lever having a tab engaging a hole in the slot when the lever is in a closed position allowing the bezel to be locked in the slot. In another implementation, the bezel includes a lever release button that locks the lever into the closed position. Pushing the lever release button releases the lever to be rotated to an open position moving the tab out of the hole in the slot. In another implementation, the lever includes a detent moved into contact into an edge of the slot to push the carrier out of the slot when the lever is in the open position. In another implementation, the bezel includes a release mechanism that holds the cover to the base. In another implementation, the cover includes registration features that position the first type of form factor. In another implementation, the first type of form factor is one of a 5.9 mm thickness E1.S form factor or an 8.1 mm thickness E1.S form factor. In another implementation, the electronic device is a solid state drive (SSD). In another implementation, the second type of form factor is one of a 9.5 mm thickness E1.S form factor or a 15 mm thickness E1.S form factor. In another implementation, the cover engages the base from a hinge, allowing the first type of form factor to be inserted in the base when the cover is rotated via the hinge.

Another disclosed example is a computer device having a chassis and a first slot supported by the chassis. A first carrier holding a first type of form factor for a device communicating with the computer system is inserted in the first slot. The first carrier includes a case holding the first type of form factor and a cover attached to the case enclosing the first type of form factor. The first carrier includes a first bezel configurable for insertion in the first slot. The bezel has an attachment surface attached to the base. A second slot is supported by the chassis. A second carrier holding a second type of form factor for a device communicating with the computer system is inserted in the second slot. The second carrier including a second bezel configurable for insertion in the first or second slot. The second bezel is identical to the first bezel. The second bezel includes an attachment surface joined to the second type of form factor.

In another implementation of the disclosed example computer device, the first bezel includes a lever having a tab engaging a hole in the first slot when the lever is in a closed position allowing the first bezel to be locked in the first slot. In another implementation, the first bezel includes a lever release button that locks the lever into the closed position. Pushing the lever release button releases the lever to allow rotation to an open position moving the tab out of the hole in the first slot. In another implementation, the lever includes a detent moved into contact into an edge of the first slot to push the first carrier out of the first slot when the lever is in the open position. In another implementation, the first bezel includes a release mechanism that holds the cover to the base. In another implementation, the cover includes registration features that position the first type of form factor. In another implementation, the first type of form factor is one of a 5.9 mm thickness E1.S form factor or an 8.1 mm thickness E1.S form factor. In another implementation, the devices are solid state drives (SSD). In another implementation, the second type of form factor is one of a 9.5 mm thickness E1.S form factor or a 15 mm thickness E1.S form factor. In another implementation, the cover engages the base from a hinge, allowing the first type of form factor to be inserted in the base when the cover is rotated via the hinge.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 3F is a perspective view of the cover in an open position of the carrier in FIG. 3A;

FIG. 3H is a top view of the cover in the open position of the carrier in FIG. 3A;

FIG. 3I shows the form factor removed from the carrier in FIG. 3A;

Figure 1:
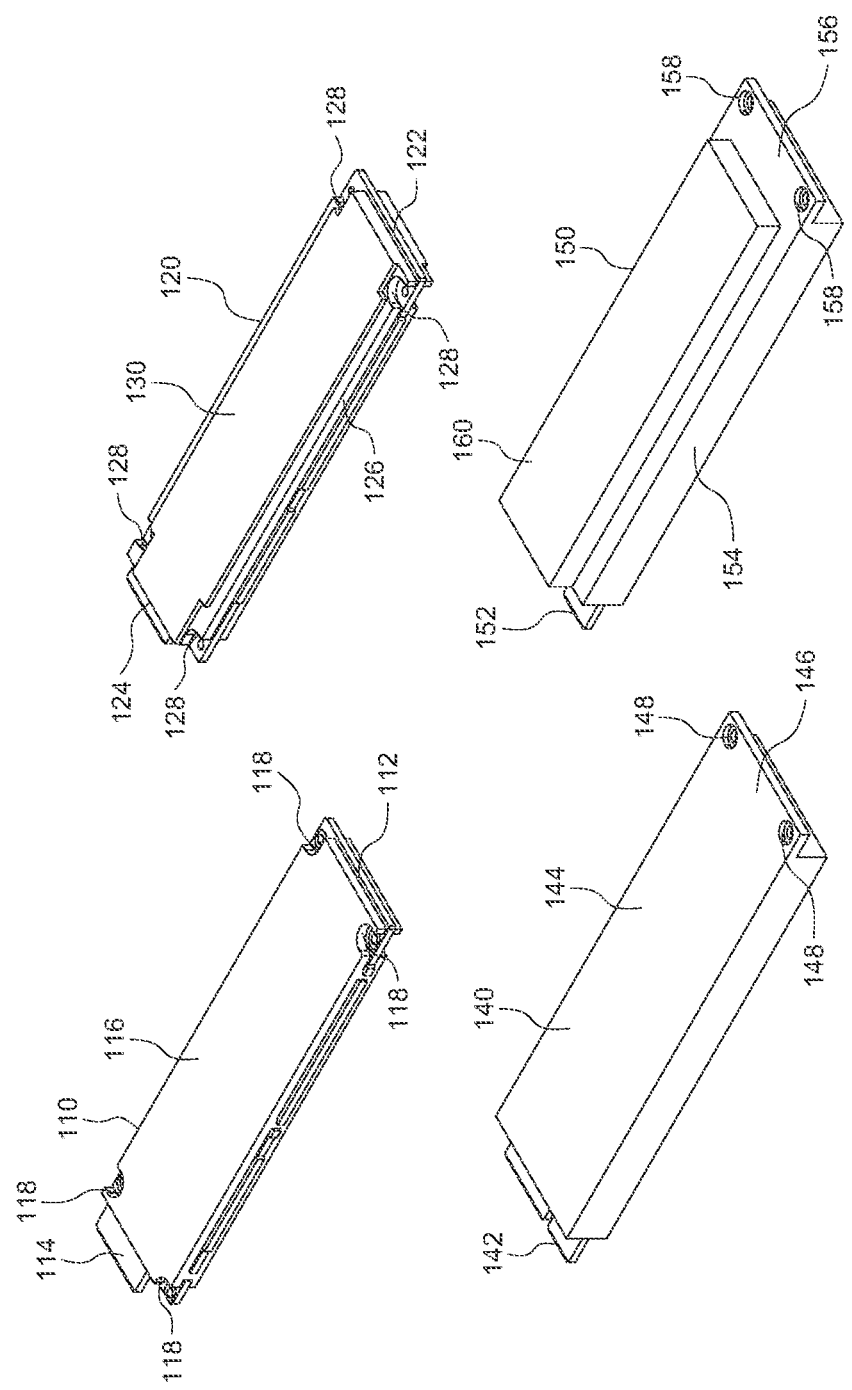
FIG. 1 shows different types of solid state drive form factors defined by the E1.S standard with different thicknesses.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward an example E1.S form factor carrier that may accommodate any one of four E1.S form factors having different thicknesses. The form factor carrier includes a bezel assembly that allows for attachment to a cover and a base to hold two different form factors. The assembled bezel, base and cover, and form factor may be inserted in a slot that allows operation of the SSD device in the form factor. The bezel alone may be attached to two other types of form factors. The assembled bezel and form factor may be inserted in a slot that allows operation of the SSD device in the form factor.

Figure 2A:
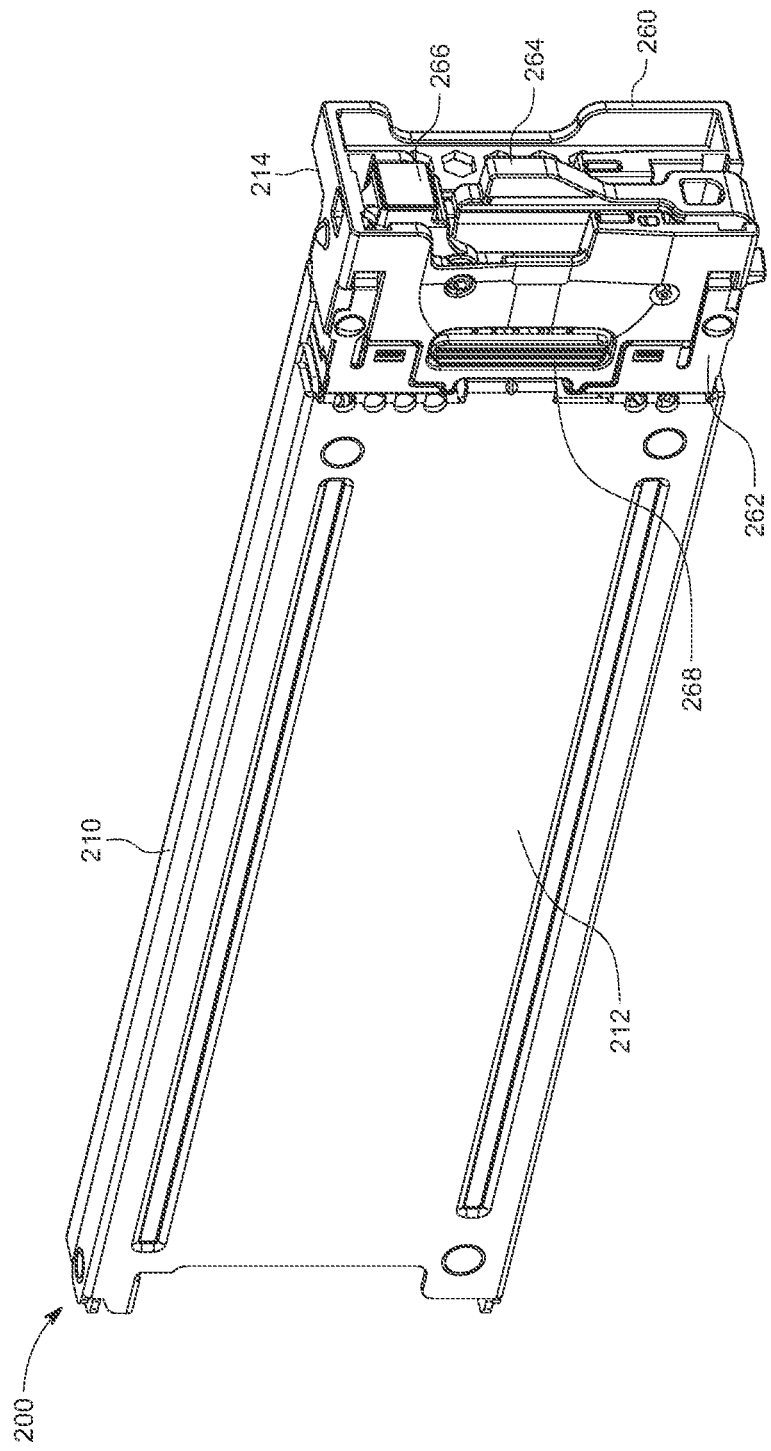
FIG. 2A is a top perspective view of the example assembled example carrier and a form factor from FIG. 1.
Figure 2B:
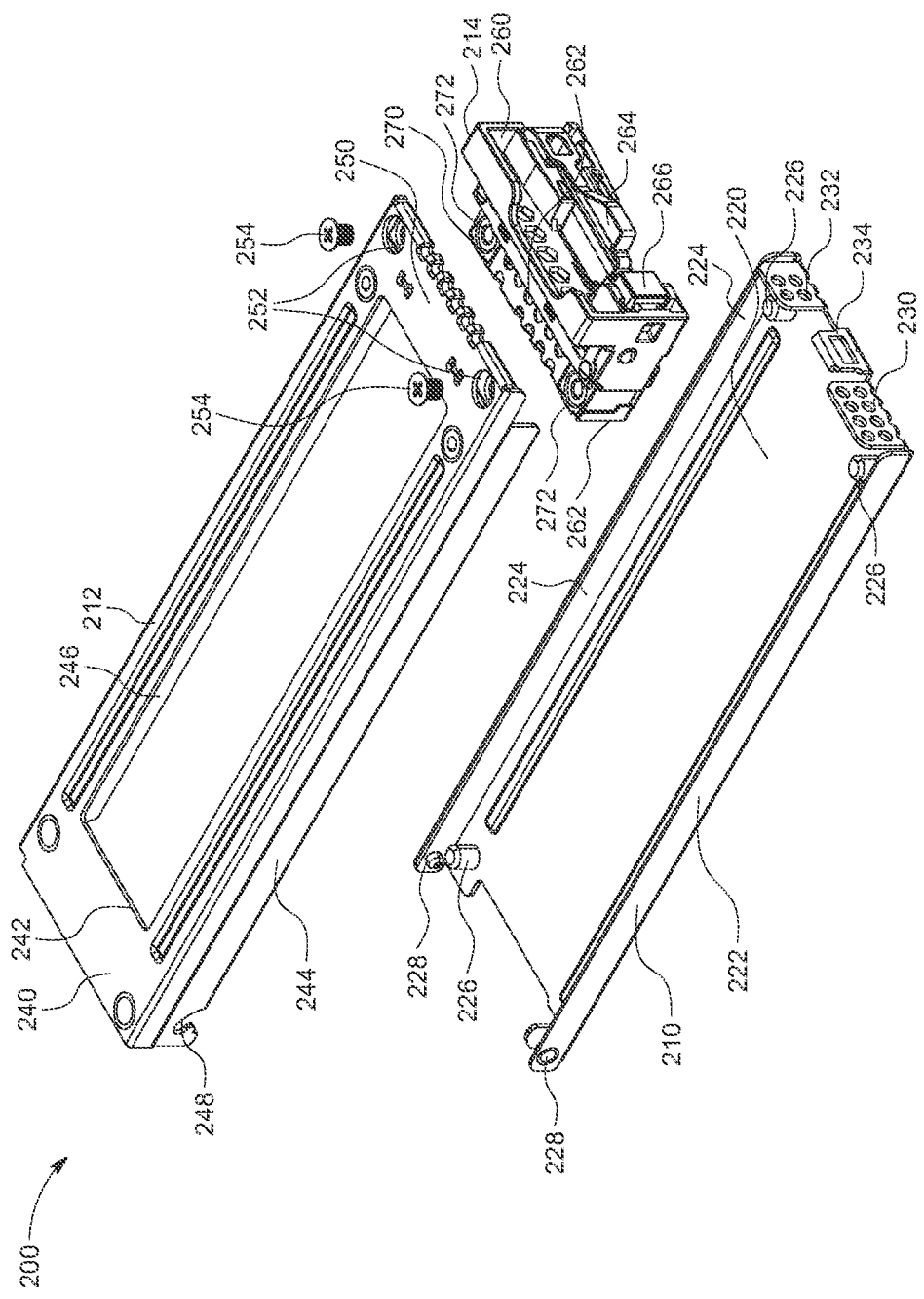
FIG. 2B is an exploded perspective view of the components of the carrier in FIG. 2A.
Figure 2C:
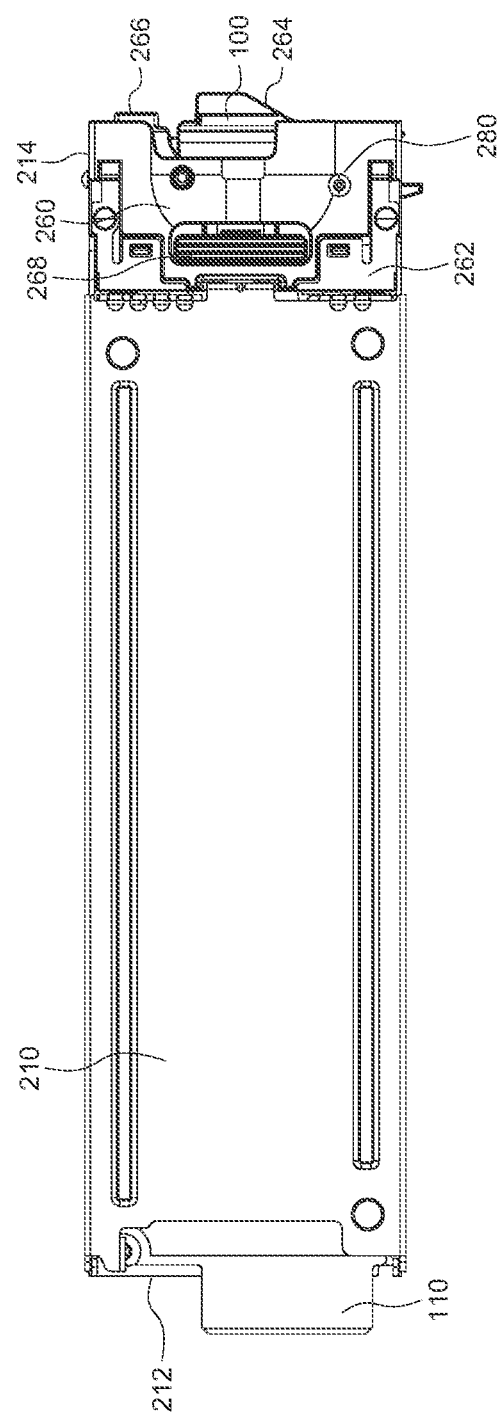
FIG. 2C is a side view of the assembled carrier in FIG. 2A.

FIG. 2A shows a perspective view of the example carrier assembly 200. FIG. 2B is an exploded view of the components of the carrier assembly 200. FIG. 2C shows a side view of the carrier assembly 200. The carrier assembly 200 includes a cover 210, a base 212, and a bezel 214 that enclose a E1.S form factor for a solid state drive (SSD), such as the form factor 110. In this example, the E1.S form factor 110 has a thickness of 5.9 mm.

The cover 210 includes a cover plate 220 that is rectangularly shaped with a length sufficient to hold either of the two thinner form factors 110 and 120 in FIG. 1A. The cover 210 includes parallel sides 222 and 224. The cover plate 220 includes an interior surface that has four pins 226 at each corner. The pins 226 mate with the cutouts on the corresponding form factors 110 and 120 in FIG. 1A to position the form factor relative to the cover 210. One end of the sides 222 and 224 include a protruding pin 228 that may be used as a hinge relative to the base 212. The opposite ends of the sides 222 and 224 are connected to respective perforated tabs 230 and 232. A latch 234 is positioned between the tabs 230 and 232.

The base 212 has a frame member 240 that is generally rectangular in shape with a rectangular aperture 242 that allows part of the enclosures of the form factors 110 and 120 to be exposed to dissipate heat. The frame member 240 is attached to two side panels 244 and 246. In this example, the side panels 244 and 246 are attached to the frame member 240 via rivets, but the side panels 244 and 246 may be fabricated from one piece with the frame member 240. One end of both the side panels 244 and 246 include a slot 248 that may be mated with the pins 228 of the cover 210 to allow the cover 210 to be rotated relative to the base 212. The frame member 240 has an end tab 250 that extends past the ends of the side panels 244 and 246. The end tab 250 includes a two screw holes 252 that accommodate screws 254 that allow attachment of the base 212 to the bezel 214.

Figure 2D:
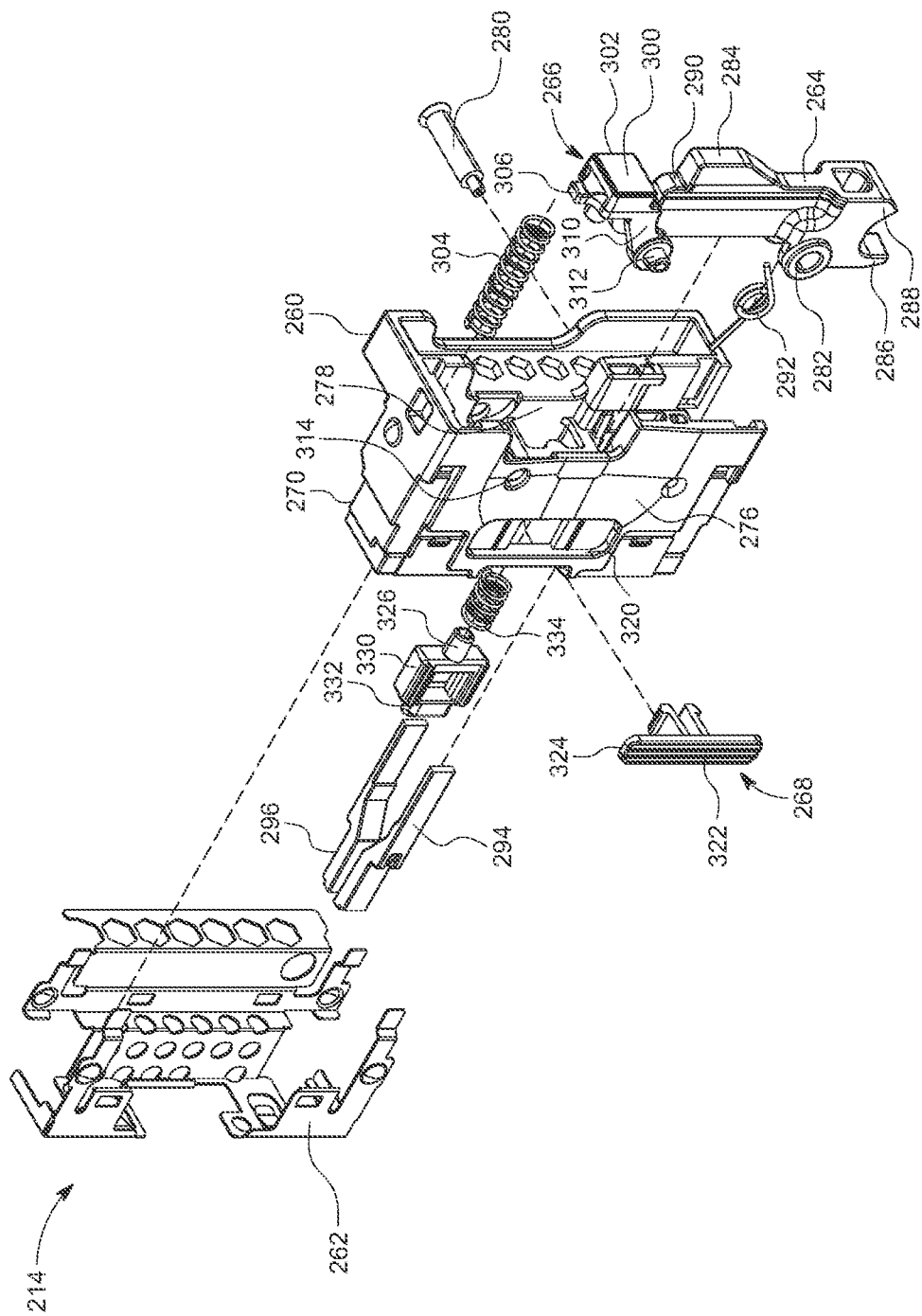
FIG. 2D is an exploded perspective view of the components of the bezel of the carrier in FIG. 2A.
Figure 2E:
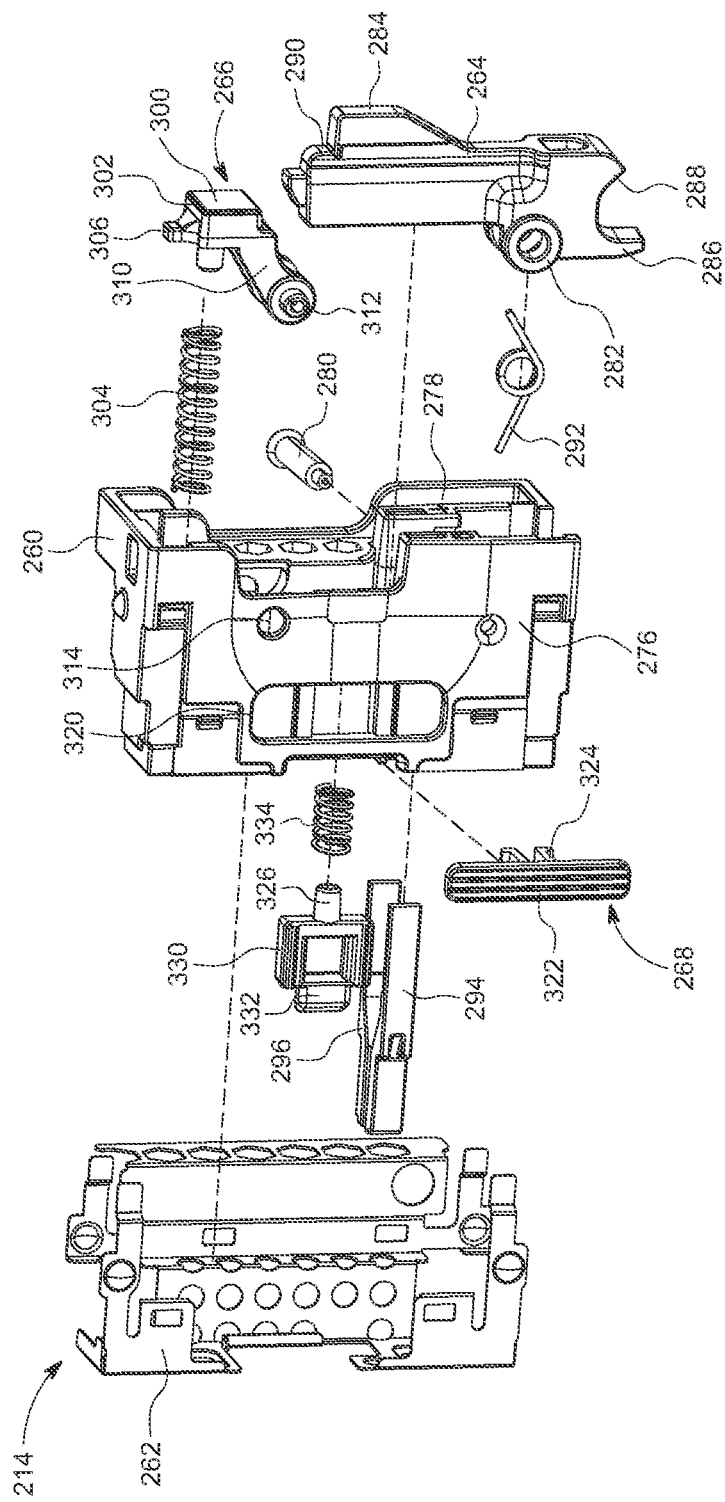
FIG. 2E is an exploded perspective view of the components of the bezel of the carrier in FIG. 2A.

The components of the bezel 214 are shown in FIGS. 2A-2B and in greater detail in FIGS. 2D-2E that show perspective exploded views of the parts of the bezel 214. The bezel 214 includes a casing 260, a frame structure 262, a lever 264, a lever button assembly 266, and a base release button assembly 268. The casing 260 includes an attachment surface 270 having two screw holes 272 for the attachment of either the base 212 shown in FIGS. 2A-2B or a form factor such as the form factors 140 and 150 in FIG. 1. The casing 260 includes two parallel plates 276 and 278 that sandwich the lever 264. In this example, the casing 260 is a sheet-metal part for electro-magnetic interference (EMI) shielding and electrostatic discharge (ESD) conduction. The frame structure 262 is fabricated from plastic in this example.

The parallel plates 276 and 278 hold a pin 280 that is inserted through a hole in the plate 278, a hole formed by a loop member 282 at one side of the lever 264, and into a hole in the plate 276. The side of the lever 264 opposite the loop member 282 includes a handle 284 that allows the lever 264 to be gripped and rotated around the pin 280. One end of the lever 264 includes a locking tab 286 and a detent 288. The opposite end of the lever 264 includes a tab 290. A spring 292 is inserted around the pin 280 to provide spring force to force the lever 264 toward the casing 260. A pair of light pipes 294 and 296 are inserted on the respective plates 276 and 278 to transmit light emitted from an LED in the device that is installed in the form factor attached to the carrier assembly 200.

The lever button assembly 266 includes a lever release button 300 formed from the surface of a casing 302. One end of a spring 304 contacts the opposite surface of the casing 302 from the release button 300. The other end of the spring 304 contacts an interior surface of the casing 260. The casing 302 is attached to an angled arm 310 that includes a pin 312 that may be inserted in a hole 314 in the plate 276 to allow the lever button assembly 266 to pivot. The spring 304 provides spring force to force the button 300 away from the casing 260.

Figure 2G:
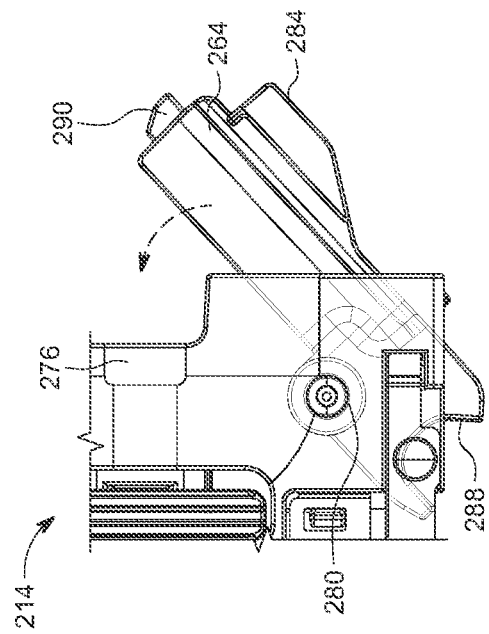
FIG. 2G is a side view of the lever of the bezel in an open position.
Figure 2F:
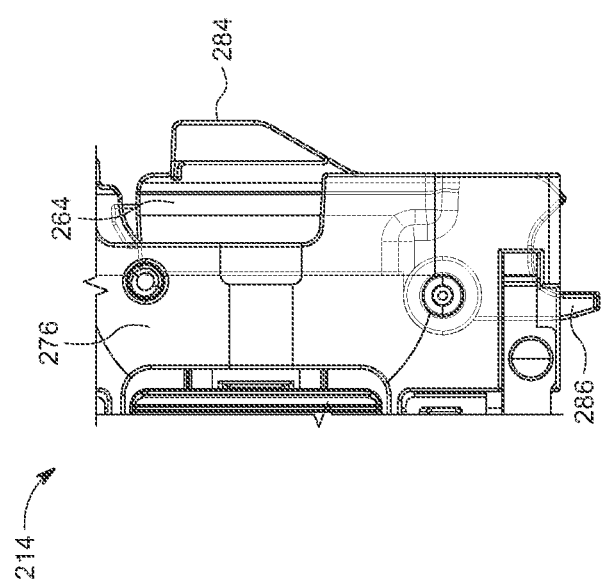
FIG. 2F is a side view of the lever of the bezel in a closed position.

FIG. 2G shows a side view of the bezel 214 with the lever 264 in an unlocked position. FIG. 2H shows a side view of the bezel 214 with the lever 264 in a locked position. When the button 300 is in a rested position, a hook 306 on the casing 302 engages the tab 290 on the lever 264 to force the lever 264 in the locked position as shown in FIG. 2F. When the button 300 is pressed into the casing 260, the casing 302 and angled arm 310 rotate on the pin 312 causing the hook 306 to move away from tab 290, thus releasing the lever 264 as shown in FIG. 2G. The spring 292 pushes the lever 264 away from the casing 260.

The exterior of the plate 276 includes an indentation 320 that holds a cover release button 322. The cover release button 322 includes a pair of arms 324 that engage a frame 330. The frame 330 is rectangular and allows the arms 324 to be inserted to be attached to the frame 330. One exterior side of the frame 330 holds a pin 326. The opposite side of the frame 330 holds a tab 332 that engages the latch 234 of the cover 210. As will be explained the cover release button 322 may be moved between the sides of the indentation 320. A spring 334 is inserted around the pin 326 such that spring force from the spring 334 forces the frame 330 and the cover release button 322 toward the exterior edge of the plate 276.

Figure 3A:
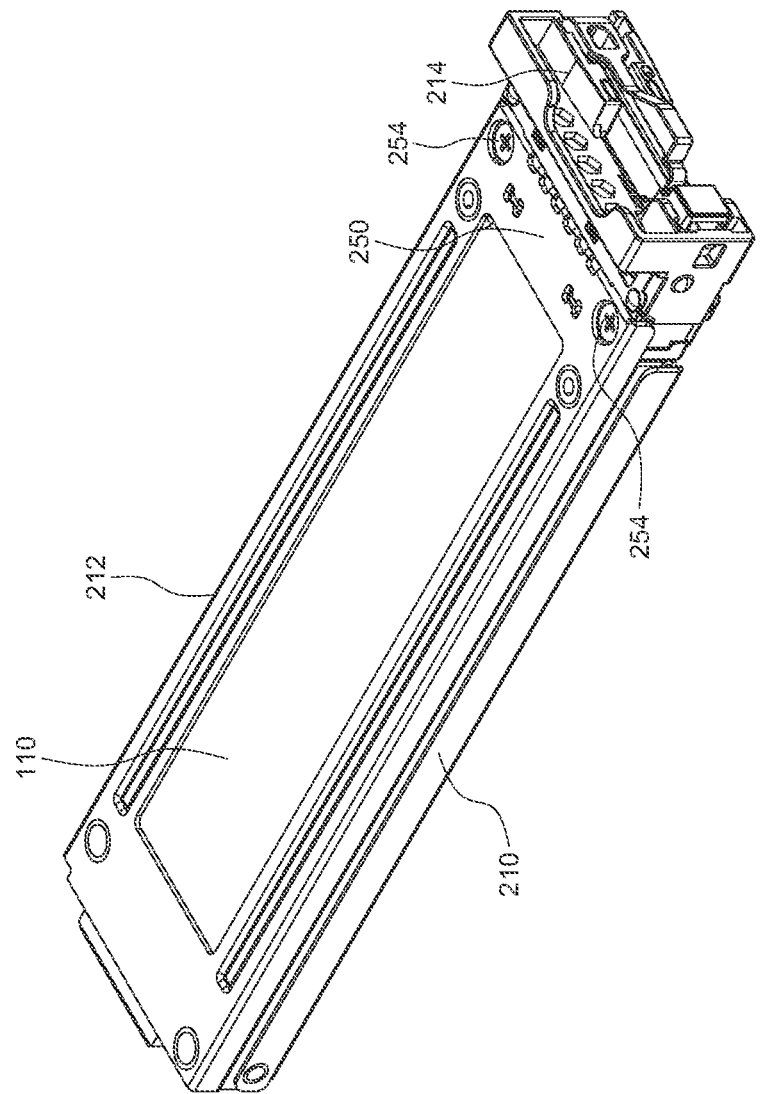
FIG. 3A is a perspective view of the installation of a form factor in FIG. 1 in the example carrier in FIG. 2A.
Figure 3B:
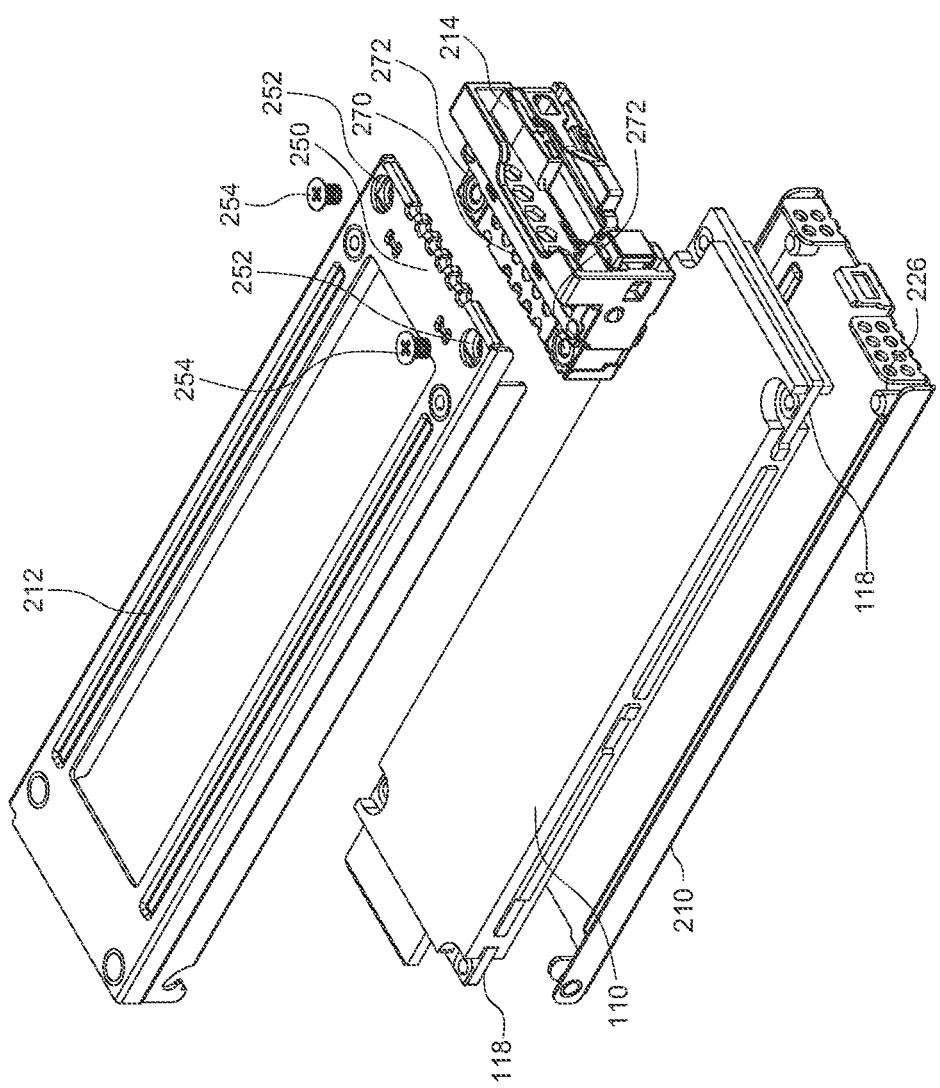
FIG. 3B is an exploded perspective view of the carrier in FIG. 2A and the form factor in FIG. 3A.
Figure 3C:
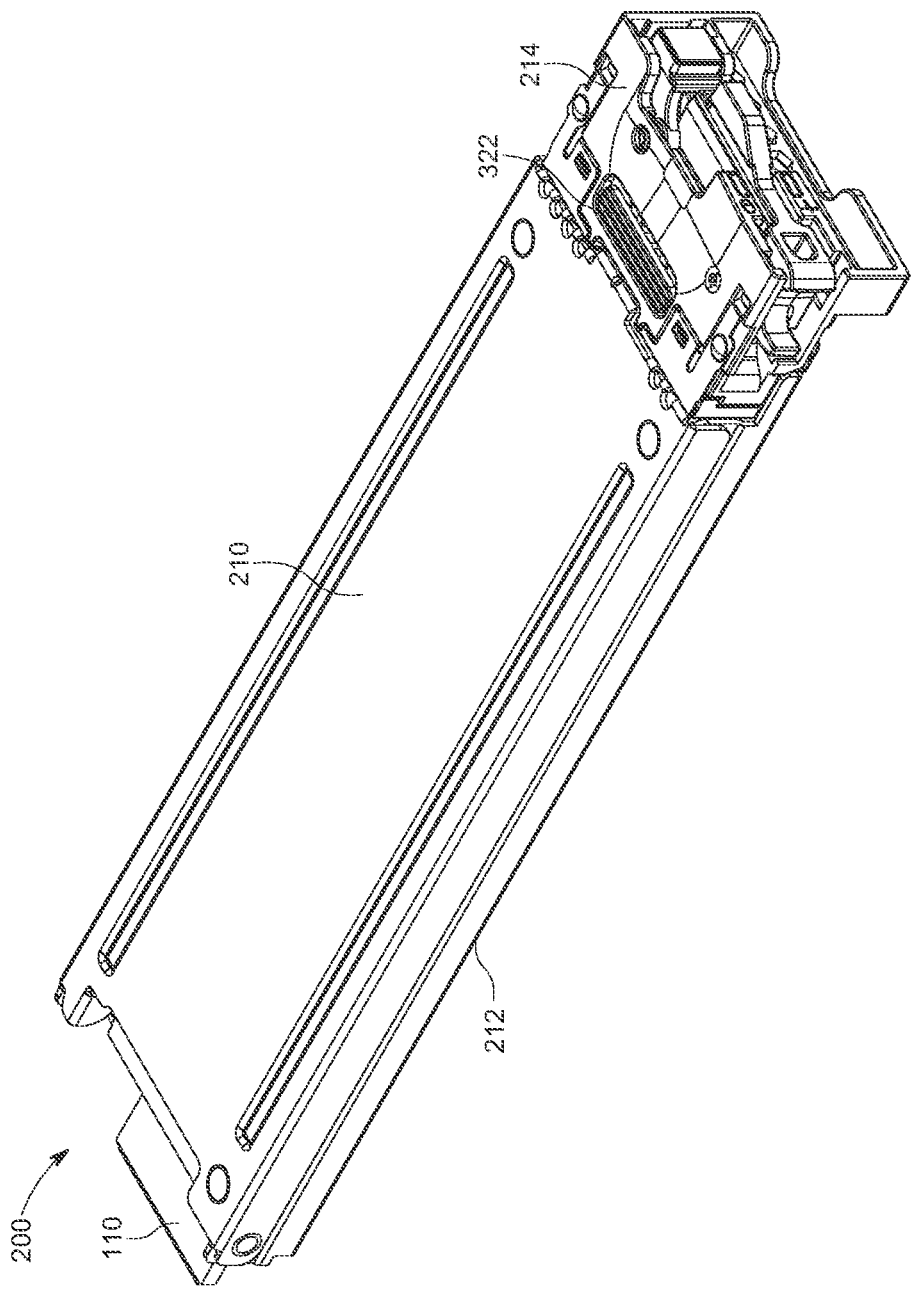
FIG. 3C is an opposite perspective view of the installation of the form factor in the example carrier in FIG. 3A.

FIG. 3A is a perspective view of the installation of the form factor 110 in FIG. 1 in the example carrier 200. FIG. 3B is an exploded perspective view of the carrier assembly 200 and the form factor 110. FIG. 3C is an opposite side perspective view of the installed form factor 110 in the example carrier assembly 200. Like components from FIGS. 2A-2H are labeled with identical reference numbers in FIGS. 3A-3C. As shown in FIGS. 3A and 3C, the cover 210 and the base 212 form an enclosure to hold the form factor 110. The bezel 214 is used to fix the carrier 200 with the form factor 110 in a slot in a computing device. In this example, the bezel 214 is attached to the base 212 via the screws 254.

Figure 3D:
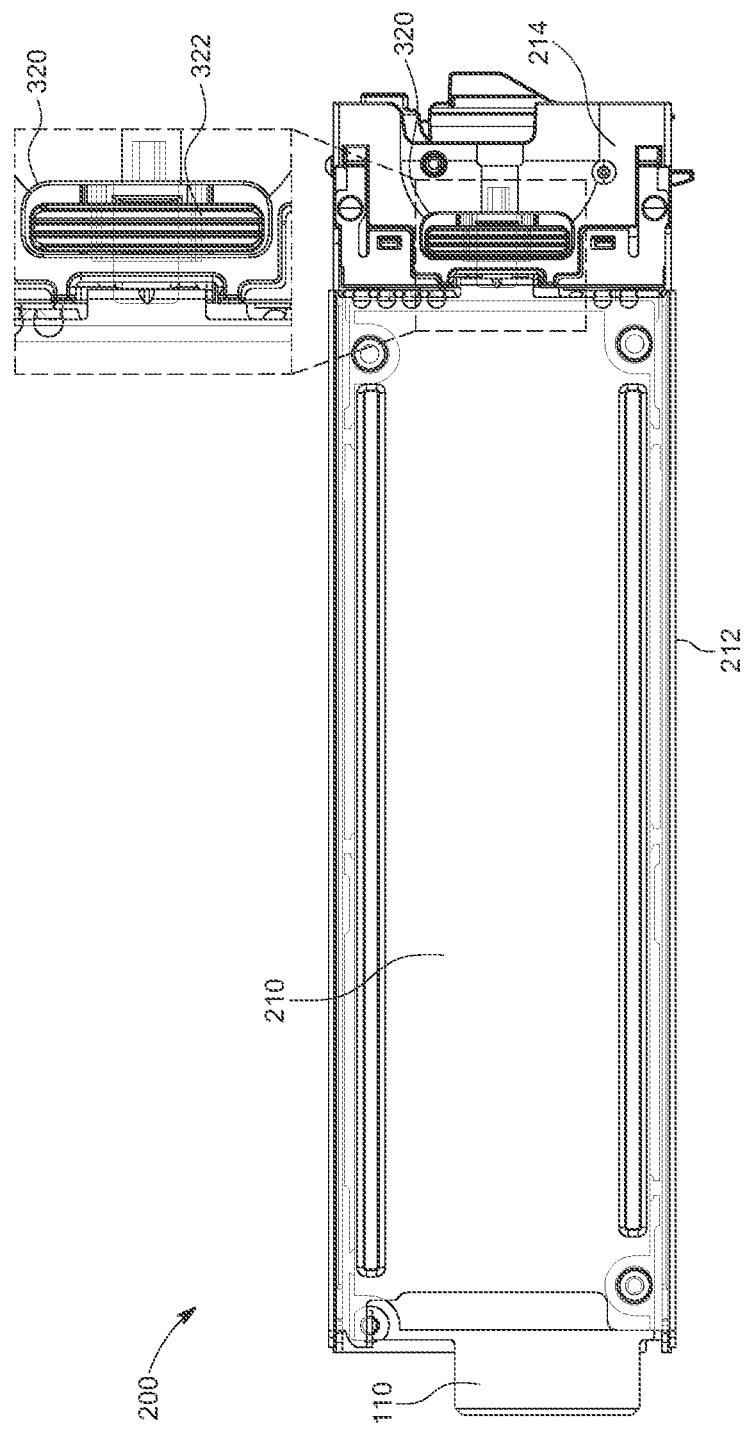
FIG. 3D is a side view of the assembled form factor and carrier in FIG. 3A.
Figure 3E:
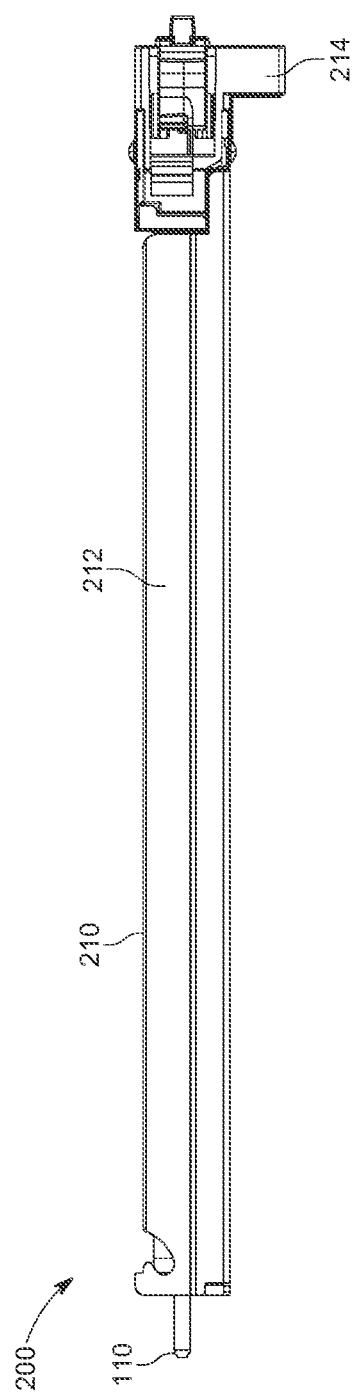
FIG. 3E is a top view of the assembled form factor and carrier in FIG. 3A.
Figure 3G:
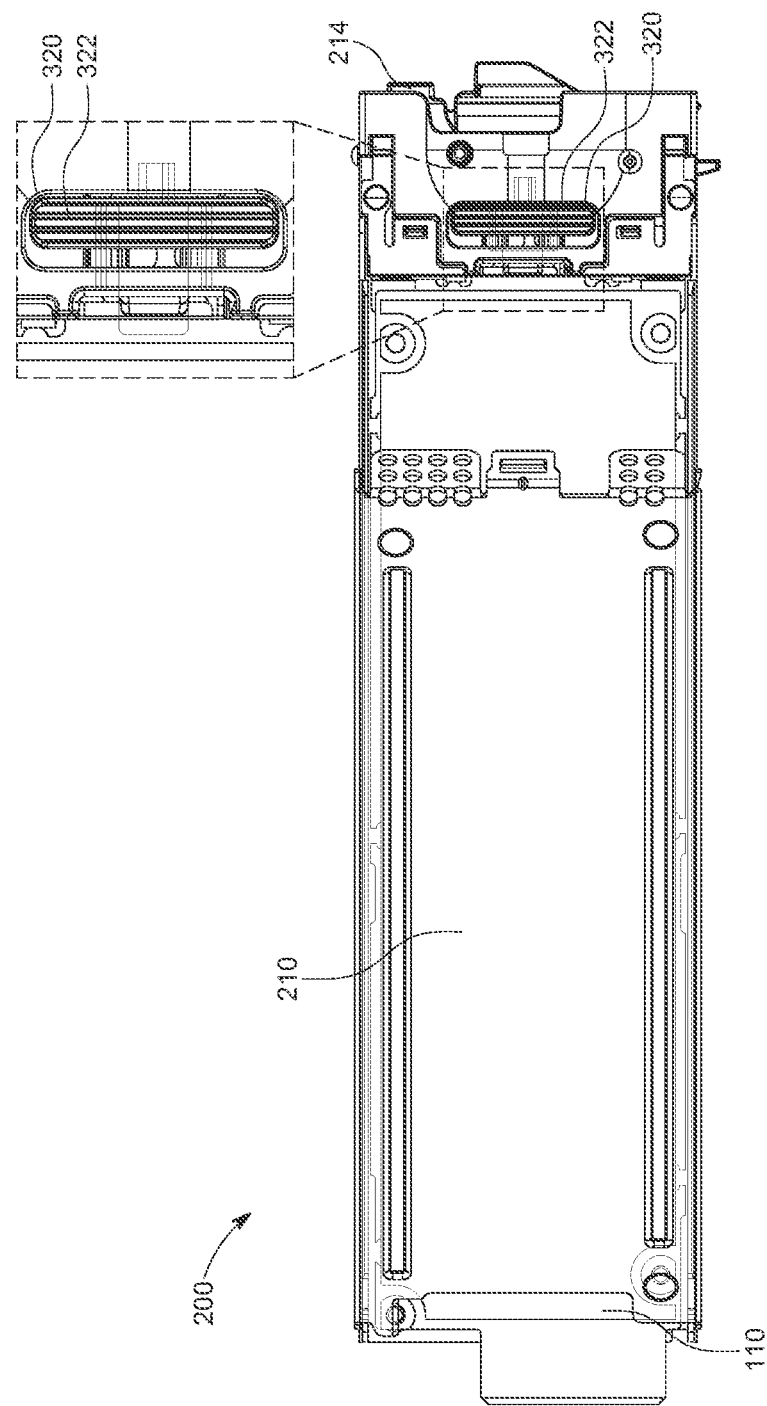
FIG. 3G is a side view of the assembled form factor showing the release of the cover.
Figure 31:
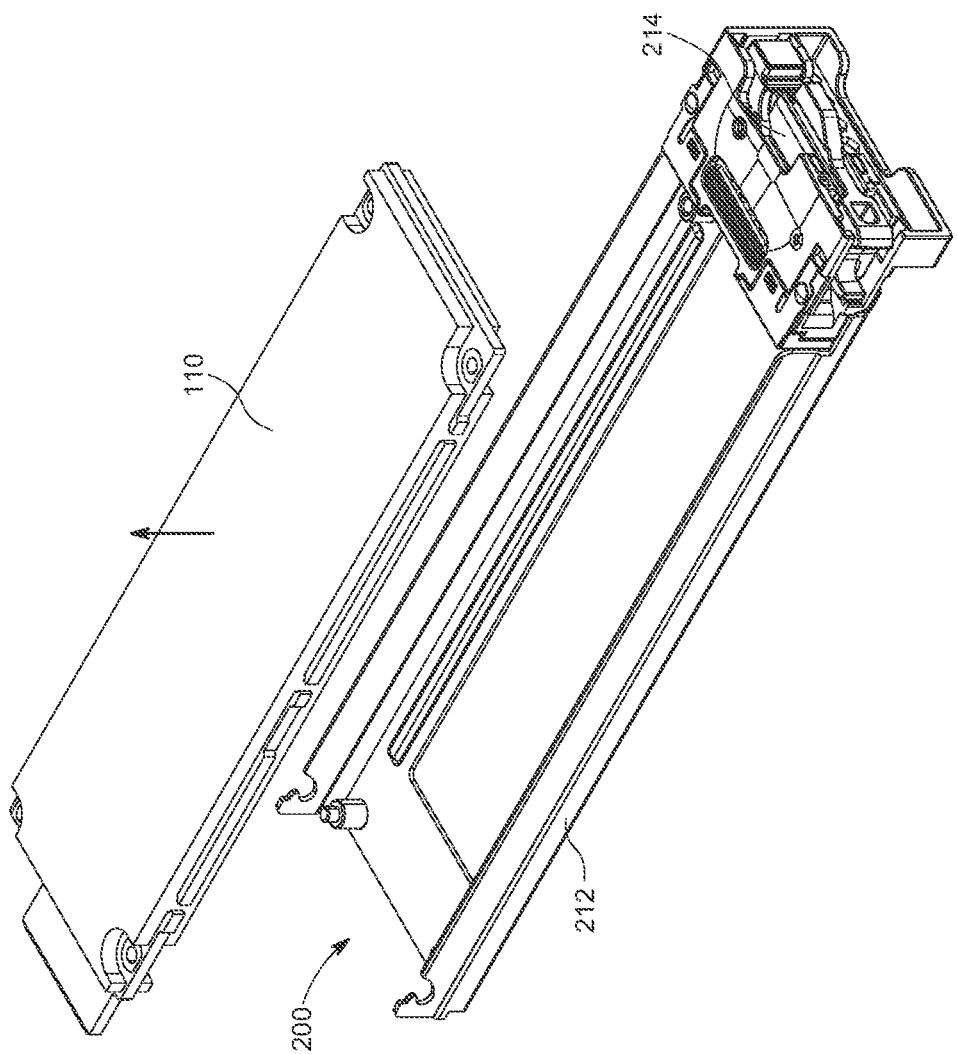

The form factor 110 is held by the base 212. When the cover 210 is closed, the cutouts 118 of the form factor 110 engage the pins 226 of the cover 210 to position the form factor 110 relative to the cover 210. When the form factor 110 is installed between the cover 210 and the base 212, the spring force from the spring 334 pushes the cover release button 322 to lock the tab 332 into the latch 234 of the cover 210, thus holding the cover 210 over the base 212. As shown in FIG. 3F-3H, the cover 210 may released from the base 212 by sliding the button 322 away from the cover 210. This disengages the tab 332 from the latch 234 of the cover 210, allowing the cover 210 to be rotated on the pins 228. When the cover 210 is opened, the form factor 110 may either be removed or inserted into the base 212. As shown in FIG. 3I, the form factor 110 may be removed from the base 212, once the cover 210 is rotated away from the base 212.

Figure 4A:
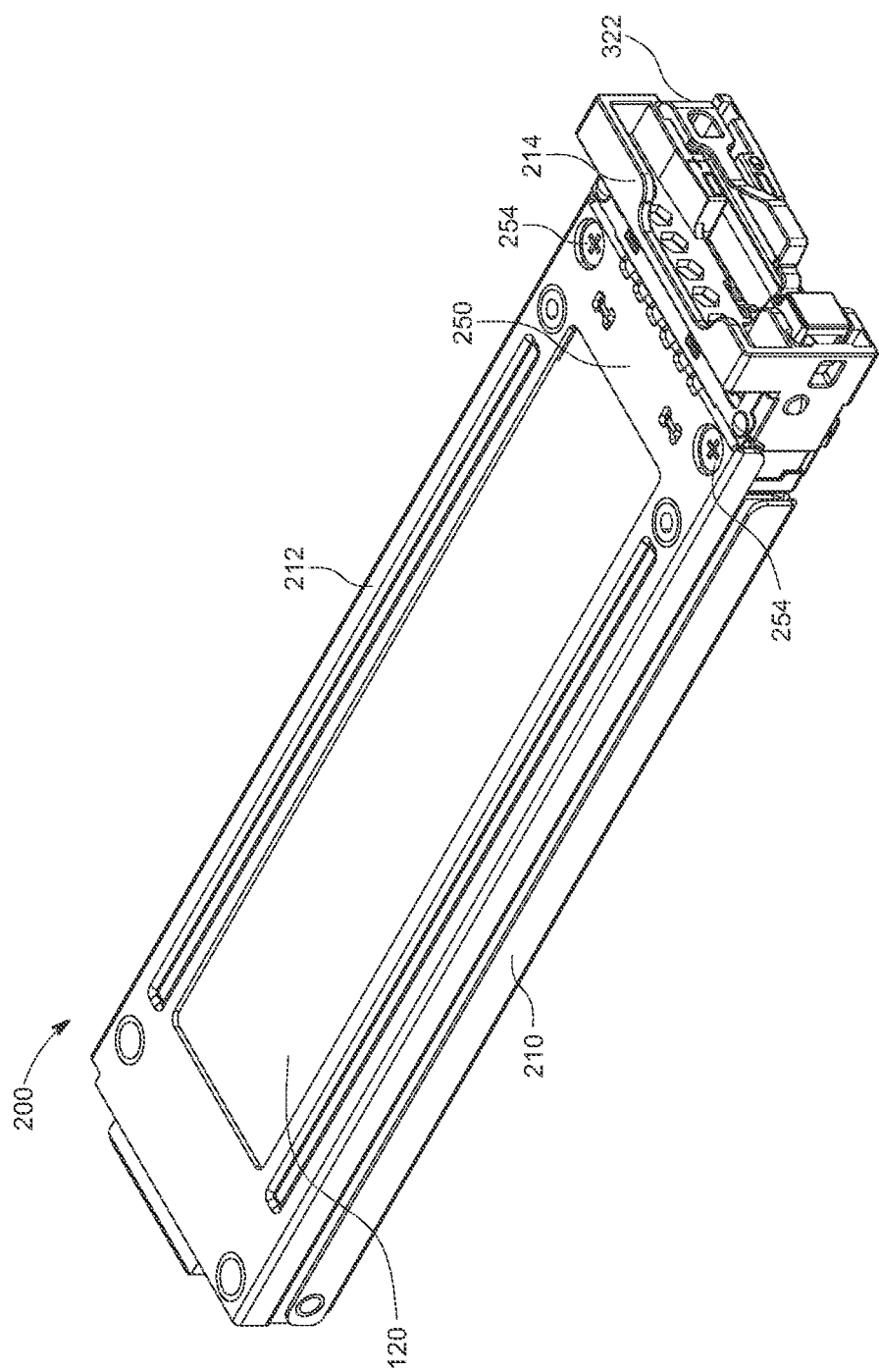
FIG. 4A is a perspective view of the installation of another form factor in FIG. 1 in the example carrier in FIG. 2A.
Figure 4B:
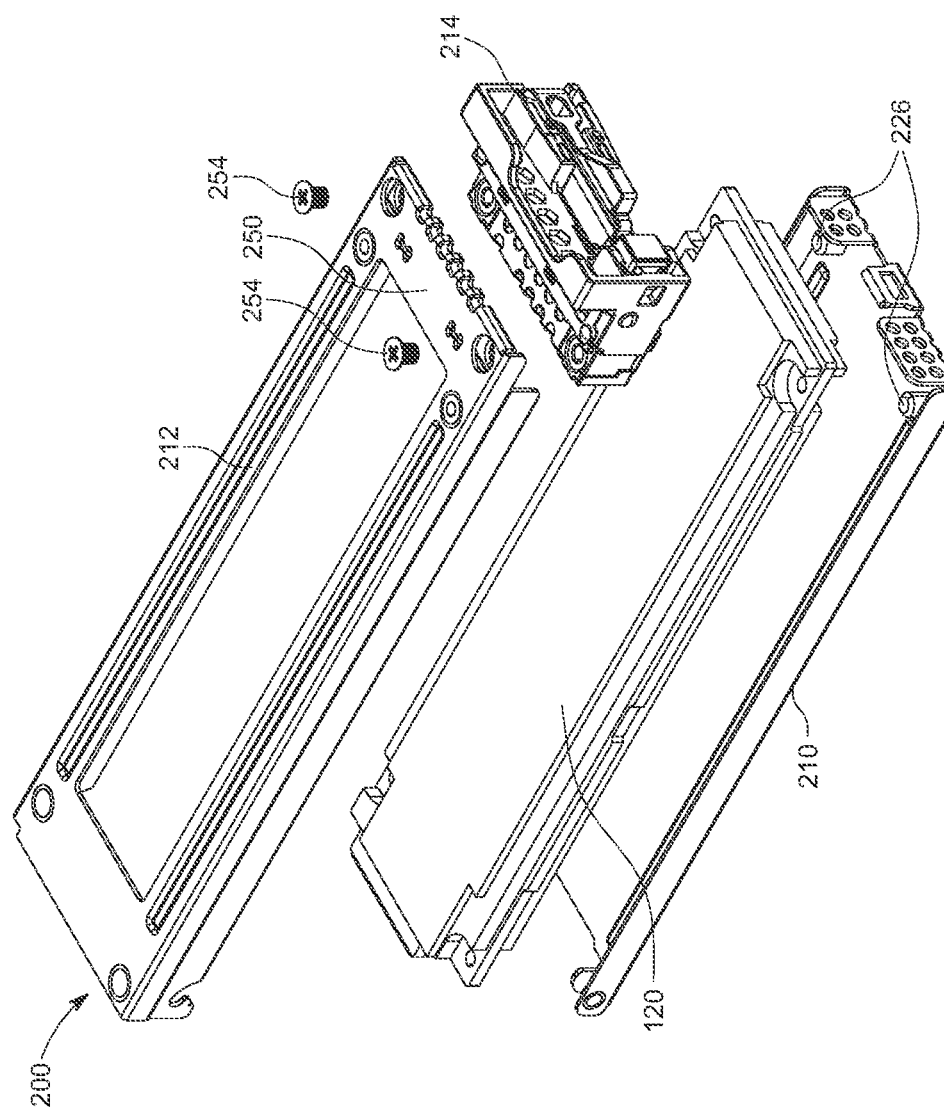
FIG. 4B is an exploded perspective view of the carrier in FIG. 2A and the form factor in FIG. 4A.

FIG. 4A is a perspective view of the installation of the form factor 120 in FIG. 1 in the example carrier assembly 200. FIG. 4B is an exploded perspective view of the carrier 200 and the form factor 120. The carrier assembly 200 functions in a similar manner in relation to the form factor 110 as shown in FIGS. 3D-3F for holding the form factor 120. Thus, the form factor 120 may be inserted in the base 212 and the cover 210 may be rotated to the closed position by sliding the button 322 to retract the tab 332 from the latch 234 of the cover 210. Once the cover 210 is closed over the base 212, the button 322 may be released allowing the 332 to engage the latch 234. This locks the cover 210 in place and enclosing the form factor 120.

Figure 5A:
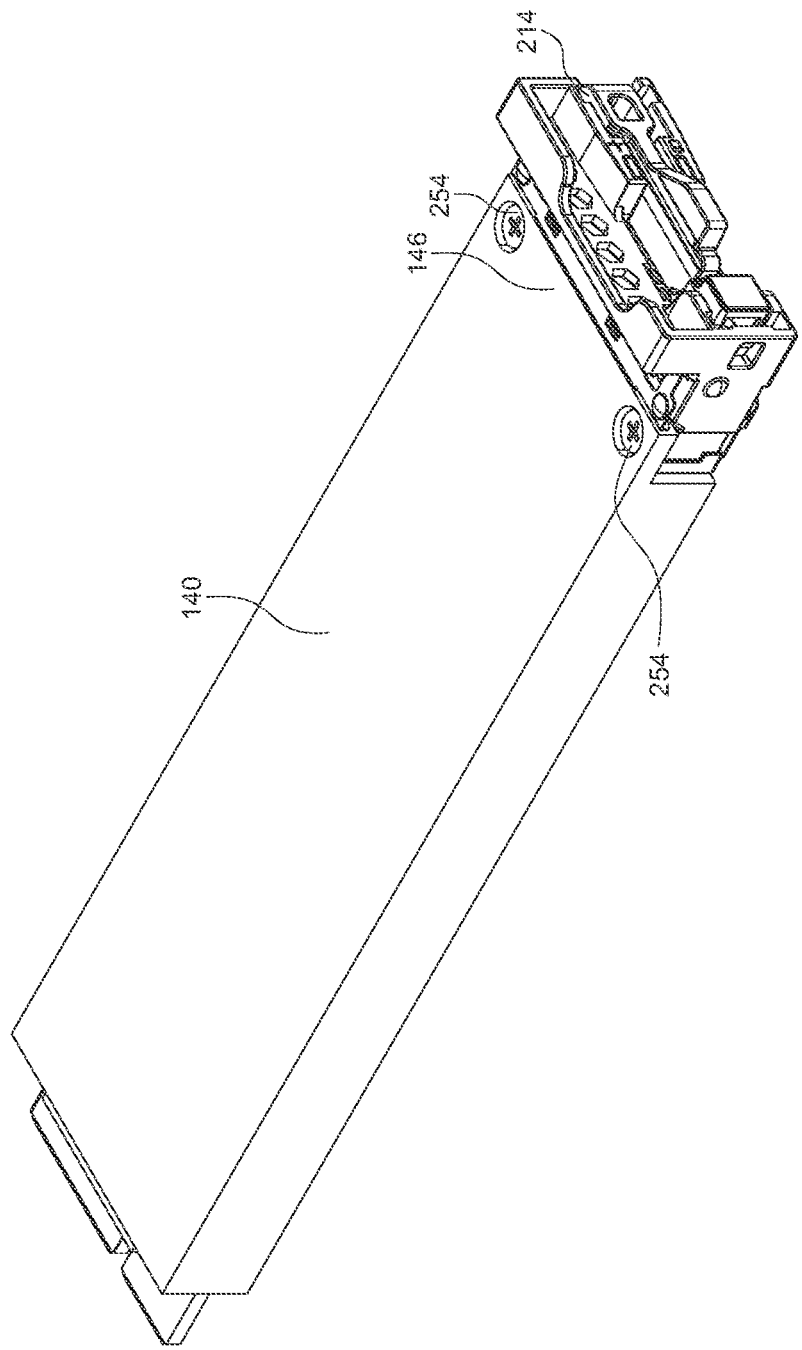
FIG. 5A is a perspective view of the installation of the bezel of the carrier in FIG. 2A on another of the form factors in FIG. 1.
Figure 5B:
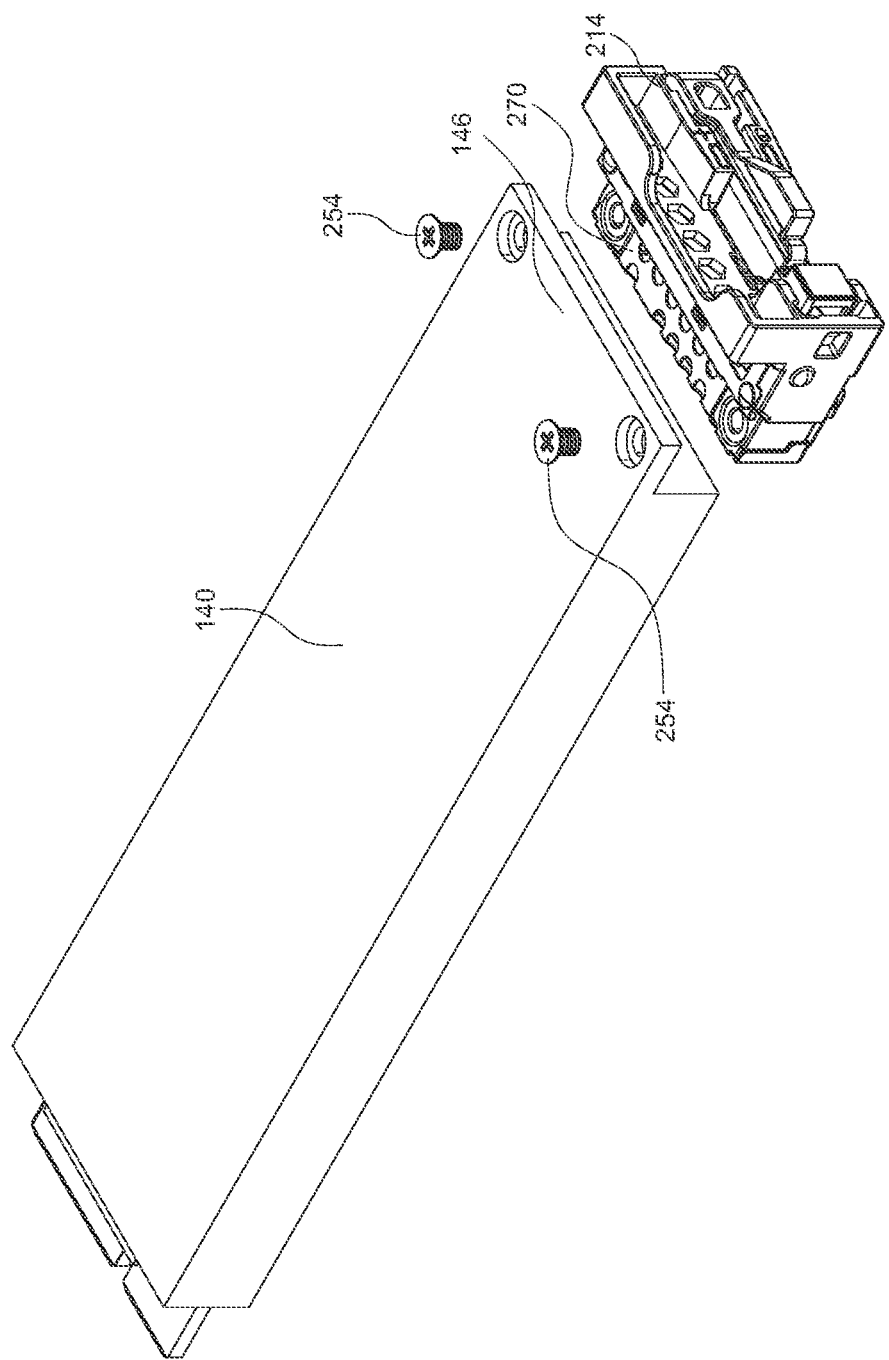
FIG. 5B is an exploded perspective view of the carrier in FIG. 2A and the form factor in FIG. 5A.

FIG. 5A is a perspective view of the installation of the bezel 214 of the carrier assembly 200 on the form factor 140 shown in FIG. 1. FIG. 5B is an exploded perspective view of the bezel 214 and the form factor 140. For thicker form factors, such as the form factor 140, the base 212 and the cover 210 are not needed. Thus, the bezel 214 alone serves as the carrier for the form factor 140. The overhanging tab 146 of the form factor 140 is placed over the attachment surface 270 of the bezel 214. The screws 254 are used to attach the overhanging tab 146 of the form factor 140 to the bezel 214. The bezel 214 and attached form factor 140 may thus be inserted into a slot in a computing device.

Figure 6A:
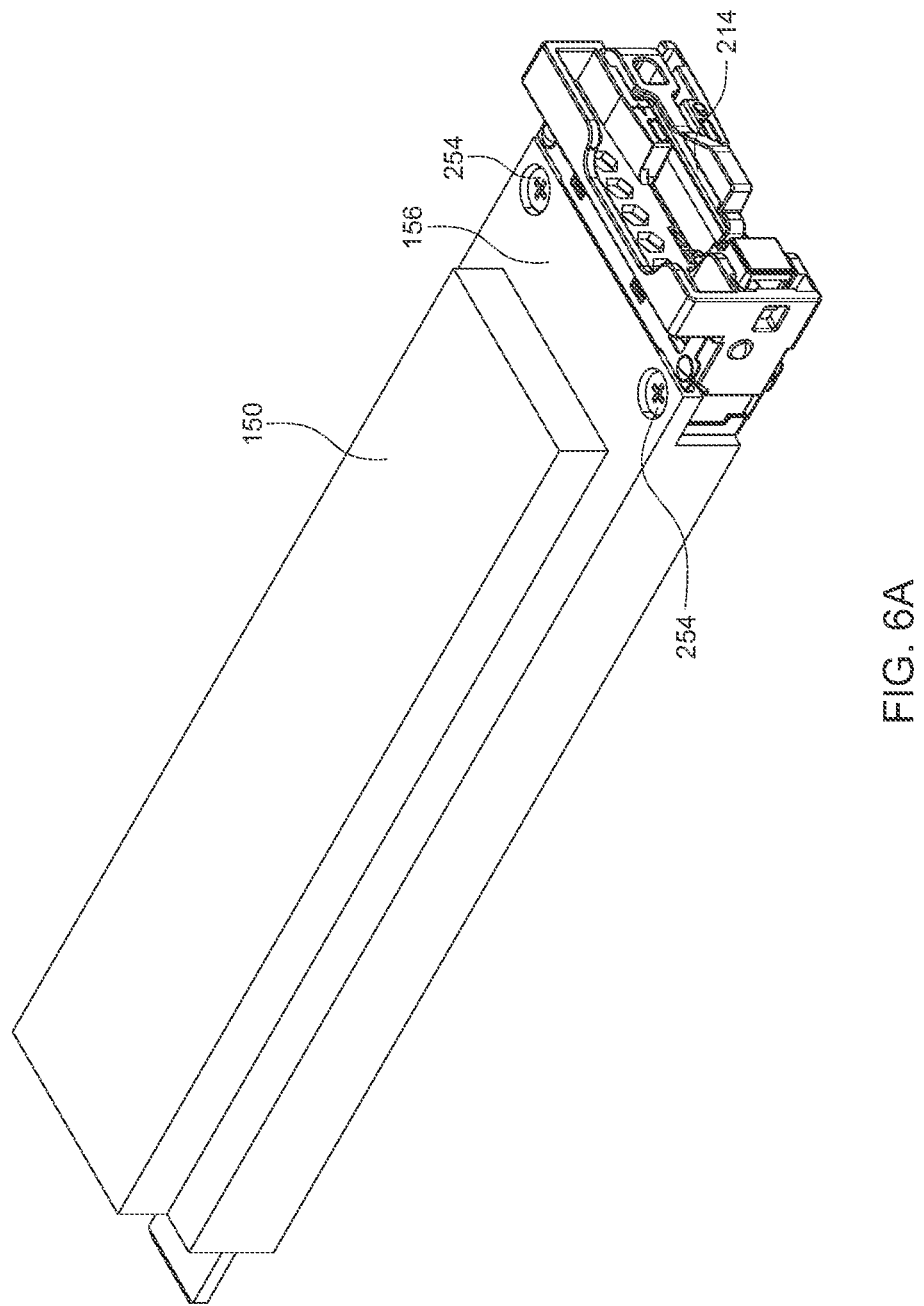
FIG. 6A is a perspective view of the installation of the bezel of the carrier in FIG. 2A on another of the form factors in FIG. 1.
Figure 6B:
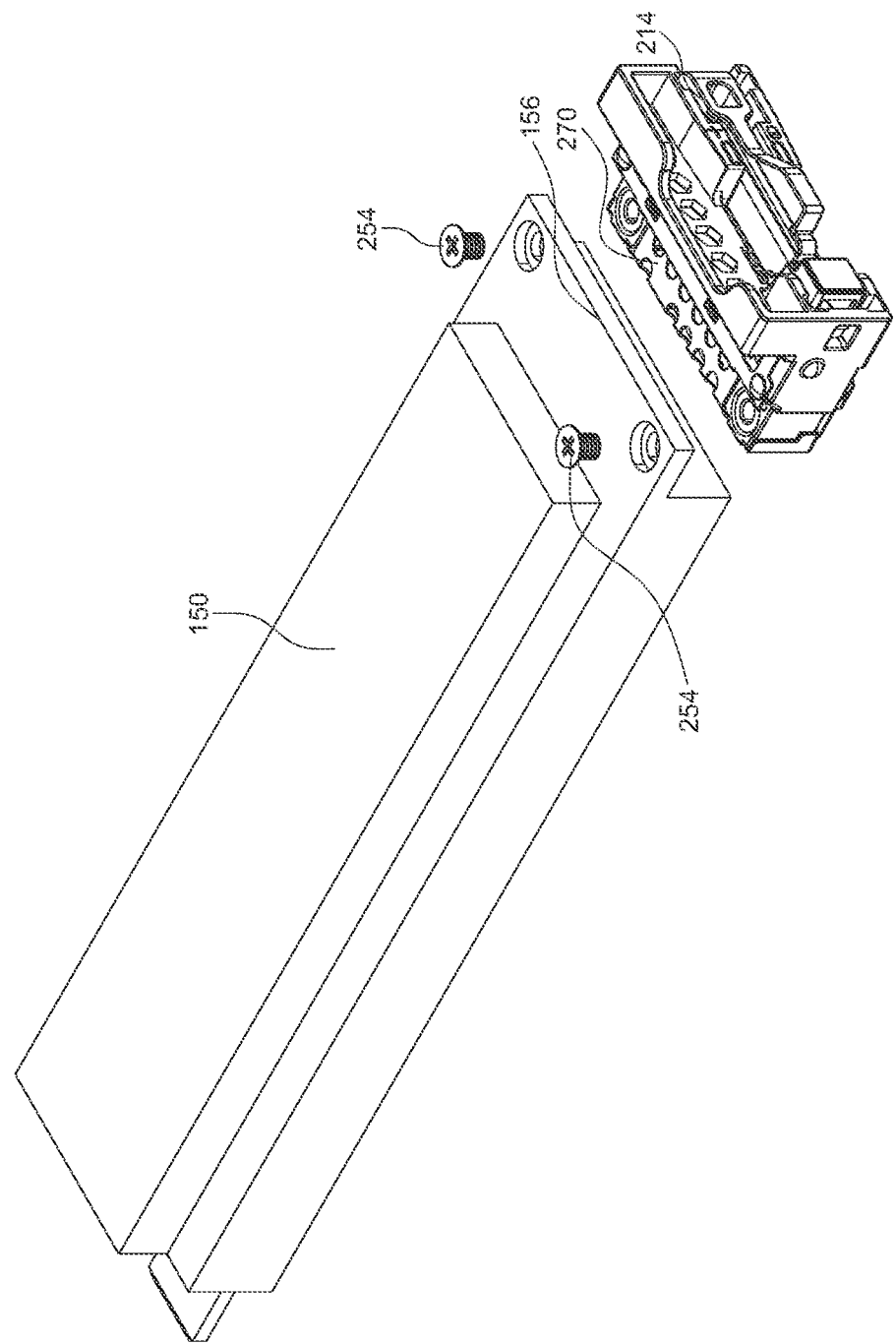
FIG. 6B is an exploded perspective view of the carrier in FIG. 2A and the form factor in FIG. 6A.

FIG. 6A is a perspective view of the installation of the bezel 214 of the carrier assembly 200 on the form factor 150 in FIG. 1. FIG. 6B is an exploded perspective view of the bezel 214 and the form factor 150. In relation to the carrier 200, the base 212 and the cover 210 are not required for the form factor 150. The overhanging tab 156 of the form factor 150 is placed over the attachment surface 270 of the bezel 214. Screws 254 are used to attach the overhanging tab 156 of the form factor 140 to the bezel 214. The bezel 214 and attached form factor 140 may thus be inserted into a slot of a computing device.

Figure 7:
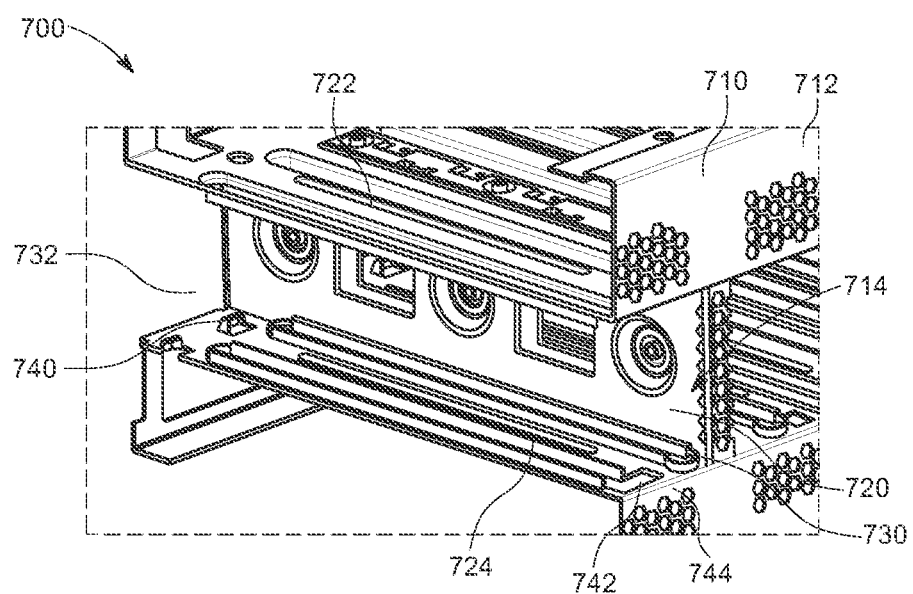
FIG. 7 is a perspective view of a slot for additional devices in a computer device.

FIG. 7 shows an example computer device 700. The computer device 700 may include a server, a storage device, a 5G component, or any other device that has slots that can accommodate form factors based on the E1.S standard. The slots of such devices thus allow the addition of SSDs or other components that may have the form factors of the E1.S standards. In this example the computer device 700 has a chassis 710 that includes a front wall 712 with a series of slots 714 for the insertion of SSD memory devices such as those with the form factors 110, 120, 140, and 150 shown in FIG. 1. In this example, there may be multiple slots 714 having uniform dimensions allowing the insertion of any of the form factors attached to the appropriate carrier, such as the carrier 200 in FIGS. 2A-2C.

The slot 714 is defined by two walls including a wall 720. FIG. 7 shows a cutaway view of the slot 714 and thus a parallel wall to the wall 720 is not shown. The wall 720 is located in perpendicular orientation to a top panel 722 and a bottom panel 724. The slot has a front open end 730 for the insertion of the carrier and form factor, and a back end 732 that typically includes a socket for the insertion of the edge connector of the form factor.

The bottom panel 724 includes an emboss 740 extending from the surface near the back end 732. An opening 742 is located near the front end 730. The front end 730 includes a lateral edge 744 that defines the bottom of the slot 714.

Figure 8A:
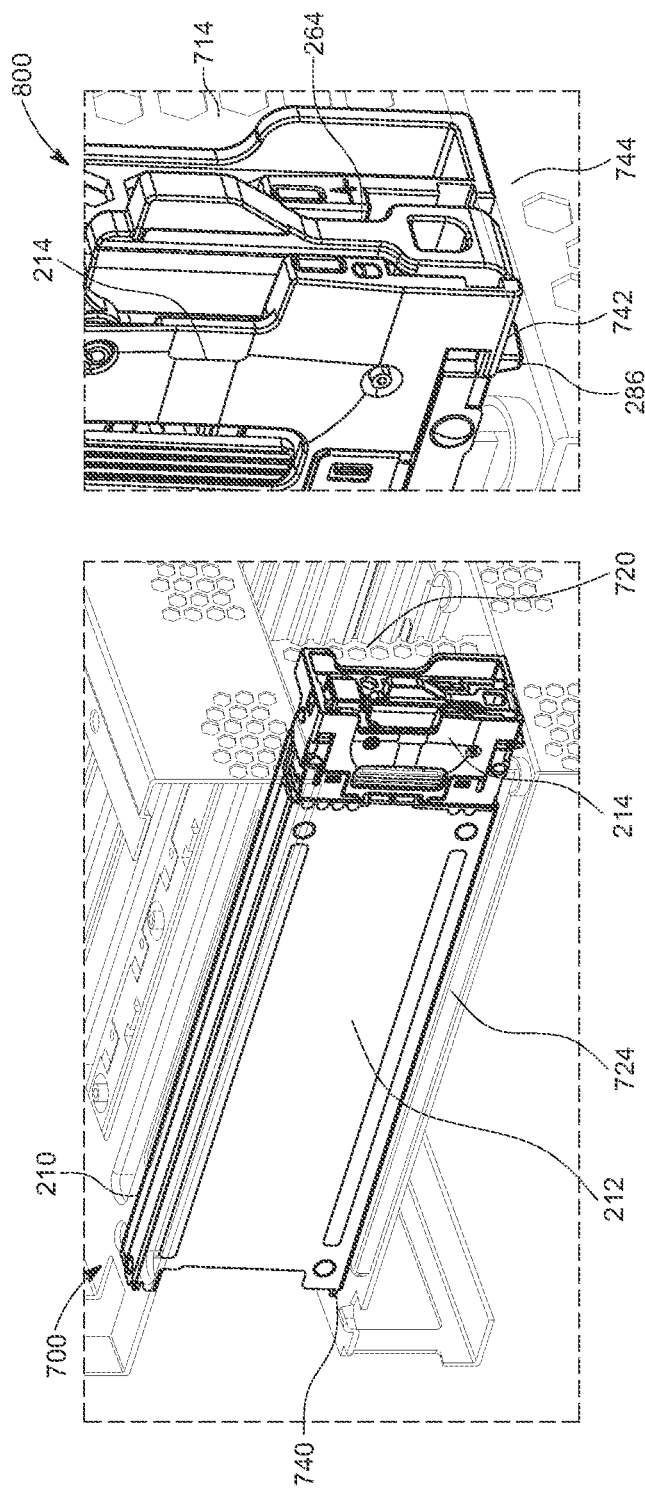
FIG. 8A is a perspective view of the example carrier inserted in the slot in the server in FIG. 7.
Figure 8B:
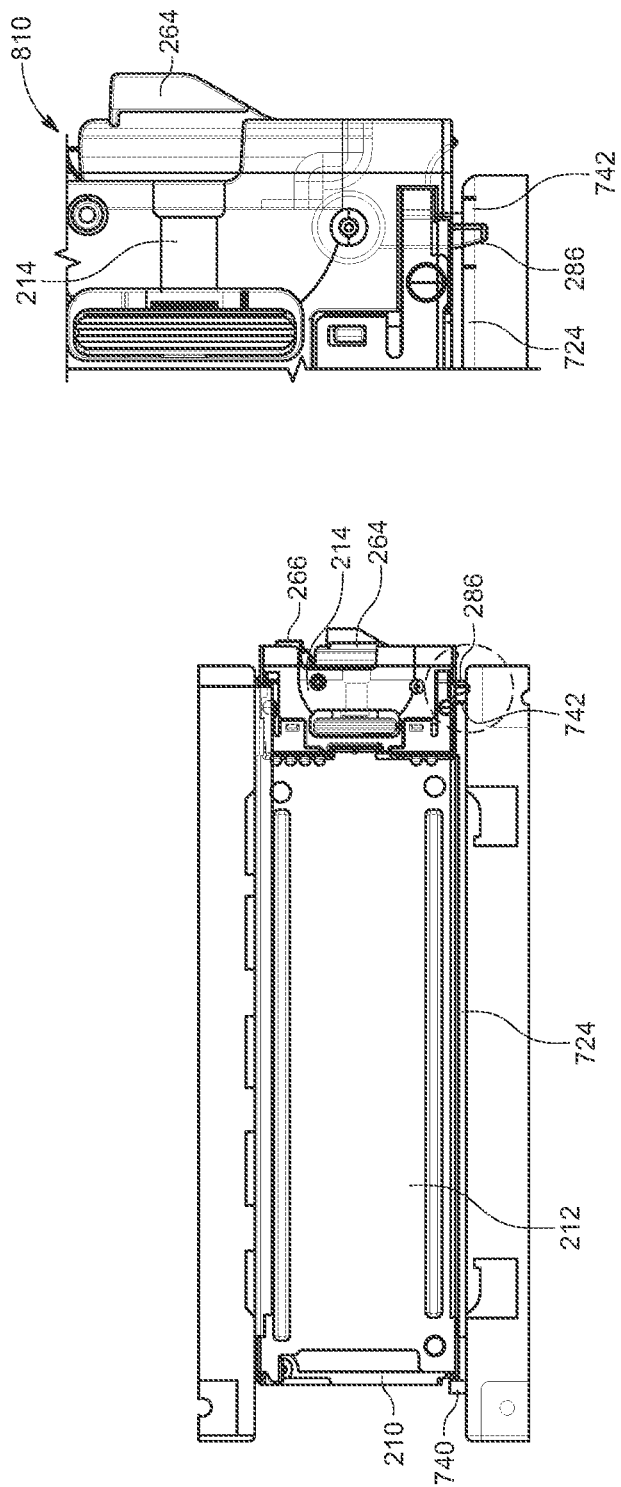
FIG. 8B is a side view of the example carrier inserted in the slot in the server in FIG. 7.

FIG. 8A is a perspective view of the example carrier 200 holding the form factor 110 that is inserted in the slot 714 in the computer device 700 in FIG. 7A. An inset 800 shows the bezel 214 in the slot 714 in detail. FIG. 8B is a side view of the example carrier 200 inserted in the slot 714 of the server 700. An inset 810 shows the bezel 214 in the slot 714 in detail. The carrier 200 with the form factor 110 may be pushed into the slot 714, until the edge of the base 212 contacts the emboss 740 at the rear of the bottom panel 724 of the slot 714. The edge connector of the form factor 110 may be inserted in a socket (not shown) in the slot 714 for providing power and allowing data signals to be exchanged between the computer device 700 and the device in the form factor 110.

As explained above, the lever 264 is in the locked position and is held by the button assembly 266 in FIGS. 8A-8B. The locking tab 286 thus is inserted in the opening 742 of the bottom panel 724. Thus, the locking tab 286 in combination with the contact of the base 212 to the emboss 740 holds the carrier 200 and form factor 110 in place in the slot 714.

Figure 8C:
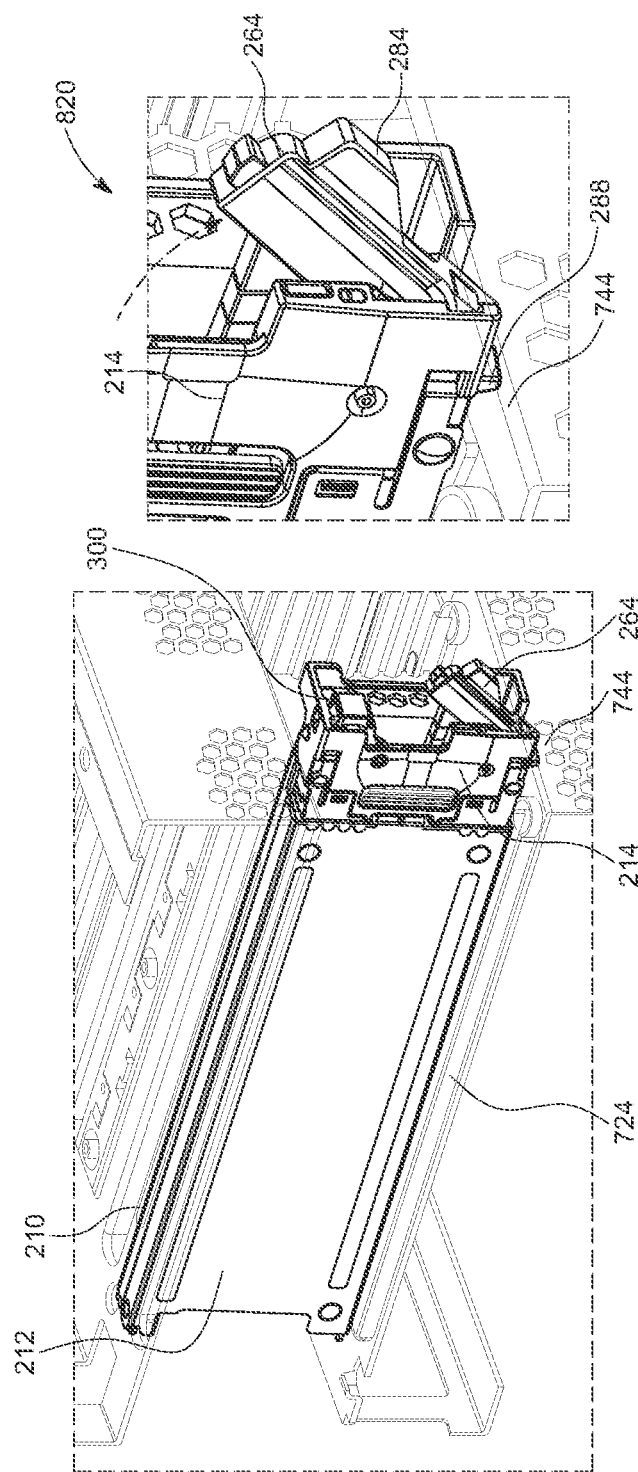
FIG. 8C is a perspective view of the example carrier being removed from the slot in the server in FIG. 7 by moving a lever.
Figure 8D:
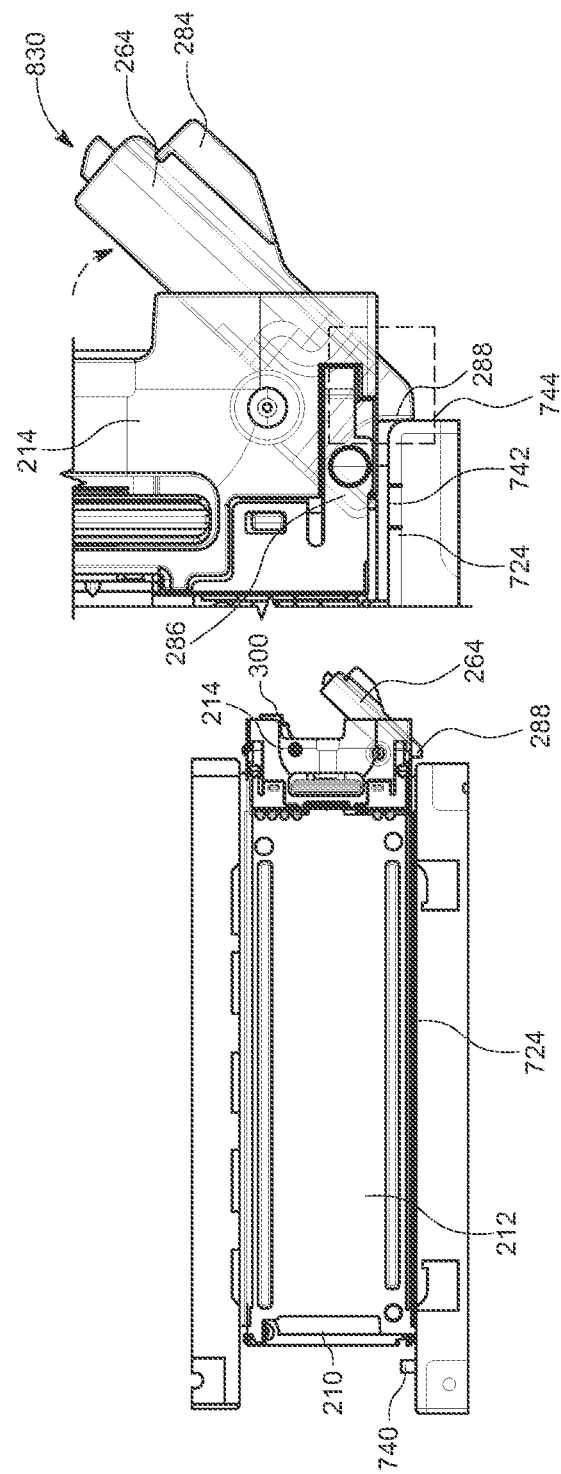
FIG. 8D is a side view of the example carrier being removed from the slot in the server in FIG. 7 by moving the lever.

FIG. 8C is a perspective view of the example carrier 200 being removed from the slot 714 by moving the lever 264 to the open position. An inset 820 shows the bezel 214 in the slot 714 in detail. FIG. 8D is a side view of the example carrier 200 being removed from the slot 714. An inset 840 shows the bezel 214 in the slot 714 in detail. As explained above, when a user desires to remove the carrier 200 and attached form factor 110, the user pushes the lever release button 300. The lever release button 300 releases the lever 264 and the internal spring 292 pushes the lever 264 away from the bezel 214. The lever 264 may then be rotated on the pin 280 by user. This movement causes the locking tab 286 to be rotated out of the opening 742 in the bottom panel 724 of the slot 714. As the user pulls the lever 264 via the handle 284, the detent 288 contacts the lateral edge 744 and thus provides force to push the bezel 214 and attached base 212 and cover 210 out of the slot 714.

As explained above, if the carrier assembly 200 is attached to the form factor 120, the operation of the lever 264 and the bezel 214 functions identically to that described in relation to FIGS. 8A-8D. If the carrier 200 is attached to the thicker form factors 140 or 150, the base 212 and cover 210 are not required. The bezel 214 is attached to the form factor 140 or 150. The respective enclosure of the form factor 140 then is simply inserted into the slot 714 and contacts the emboss 740.

The carrier assembly 200 allows for accommodation for any of the four form factors 110, 120, 140 and 150 shown in FIG. 1. Thus, the carrier 200 may allow any of four kinds of E1.S form factors to be installed in one system that has slots such as a server, storage server or the like. With the example E1.S form factor carrier, users can select the suitable E1.S SSD form factor from four kinds of thickness of E1.S to replace another form factor. Thus, the example carrier allows flexibility for upgrades to computer devices such as servers.

As explained above, the lever 264 of the bezel 214 allows a E1.S form factor module with the carrier 200 to be installed or uninstalled from a slot without requiring tools. When a user would like to service the E1.S form factor module installed in a computer device, the user can simply rotate the lever 264 to install or uninstall the E1.S form factor. Thus, the example carrier allows more convenience and less labor in servicing add on devices installed in slots of a computer device.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A carrier for attachment to different form factors, the carrier comprising:
    a base having a rectangular frame member and two side panels attached to opposite sides of the frame member, the base holding a first type of form factor, the first type of form factor having a width to allow the first type of form factor to be positioned between the two side panels and resting against the rectangular frame of the base;
    a bezel configurable for insertion in a slot for a device of the first type of form factor, the bezel having an attachment surface, wherein the base is attachable to the attachment surface of the bezel, and wherein a second type of form factor is attachable to the attachment surface, wherein the bezel has a width less than a length between the two side panels of the base, wherein the second type of form factor has a width identical to the width of the first type of form factor; and
    a cover enclosing the first type of form factor when joined to the base, wherein the base and cover are discarded when the second type of form factor is attached to the bezel, and wherein the bezel and attached second type of form factor are insertable in the slot.

2. The carrier of claim 1, wherein the bezel includes a lever having a tab, the tab engaging a hole in the slot when the lever is in a closed position, allowing the bezel to be locked in the slot.

3. The carrier of claim 2 wherein the bezel includes a lever release button that locks the lever into the closed position, wherein pushing the lever release button releases the lever to be rotated to an open position moving the tab out of the hole in the slot.

4. The carrier of claim 3, wherein the lever includes a detent moveable into contact with an edge of the slot to push the carrier out of the slot when the lever is in the open position.

5. The carrier of claim 1, wherein the bezel includes a release mechanism that holds the cover to the base.

6. The carrier of claim 1, wherein the cover includes registration features that position the first type of form factor.

7. The carrier of claim 1, wherein the first type of form factor is one of a 5.9 mm thickness E1.S form factor or an 8.1 mm thickness E1.S form factor.

8. The carrier of claim 1, wherein the electronic device is a solid state drive (SSD).

9. The carrier of claim 1, wherein the second type of form factor is one of a 9.5 mm thickness E1.S form factor or a 15 mm thickness E1.S form factor.

10. The carrier of claim 1, wherein the cover engages the base from a hinge, allowing the first type of form factor to be inserted in the base when the cover is rotated via the hinge.

11. A computer device comprising:
a chassis;
a first slot supported by the chassis;
a first carrier holding a first type of form factor for a first device communicating with the computer device, the first carrier inserted in the first slot, the first carrier including:
- a base having a rectangular frame member and two side panels attached to opposite sides of the frame member, the base holding the first type of form factor, the first type of form factor having a width to allow the first type of form factor to be positioned between the two side panels and resting against the rectangular frame of the base;
- a cover attached to the case enclosing the first type of form factor; and
- a first bezel configurable for insertion in the first slot, the first bezel having an attachment surface attached to the base, wherein the first bezel has a width less than a length between the two side panels of the base;

a second slot supported by the chassis; and
a second carrier holding a second type of form factor for a second device communicating with the computer system, the second carrier inserted in the second slot, the second carrier including a second bezel configurable for insertion in the first or second slot, the second bezel identical to the first bezel, wherein the second bezel includes an attachment surface joined to the second type of form factor, and wherein the second type of form factor has a width identical to the width of the first type of form factor.

12. The computer device of claim 11, wherein the first bezel includes a lever having a tab engaging a hole in the first slot when the lever is in a closed position, the tab allowing the first bezel to be locked in the first slot.

13. The computer device of claim 12 wherein the first bezel includes a lever release button that locks the lever into the closed position, wherein pushing the lever release button releases the lever to allow rotation to an open position moving the tab out of the hole in the first slot.

14. The computer device of claim 13, wherein the lever includes a detent moveable into contact into an edge of the first slot to push the first carrier out of the first slot when the lever is in the open position.

15. The computer device of claim 11, wherein the first bezel includes a release mechanism that holds the cover to the base.

16. The computer device of claim 11, wherein the cover includes registration features that position the first type of form factor.

17. The computer device of claim 11, wherein the first type of form factor is one of a 5.9 mm thickness E1.S form factor or an 8.1 mm thickness E1.S form factor.

18. The computer device of claim 11, wherein the first and second devices are solid state drives (SSD).

19. The computer device of claim 11, wherein the second type of form factor is one of a 9.5 mm thickness E1.S form factor or a 15 mm thickness E1.S form factor.

20. The computer device of claim 11, wherein the cover engages the base from a hinge, allowing the first type of form factor to be inserted in the base when the cover is rotated via the hinge.

* * * * *